US009343507B2

(12) United States Patent
Takaki

(10) Patent No.: US 9,343,507 B2
(45) Date of Patent: May 17, 2016

(54) DUAL CHANNEL VERTICAL FIELD EFFECT TRANSISTOR INCLUDING AN EMBEDDED ELECTRODE

(71) Applicant: SanDisk 3D LLC, Milpitas, CA (US)

(72) Inventor: Seje Takaki, Yokkaichi (JP)

(73) Assignee: SANDISK 3D LLC, Milpitas, CA (US)

( * ) Notice: Subject to any disclaimer, the term of this patent is extended or adjusted under 35 U.S.C. 154(b) by 0 days.

(21) Appl. No.: 14/206,196

(22) Filed: Mar. 12, 2014

(65) Prior Publication Data

US 2015/0263074 A1     Sep. 17, 2015

(51) Int. Cl.
| | |
|---|---|
| *H01L 29/76* | (2006.01) |
| *H01L 27/24* | (2006.01) |
| *H01L 29/78* | (2006.01) |
| *H01L 29/66* | (2006.01) |
| *H01L 27/115* | (2006.01) |

(Continued)

(52) U.S. Cl.
CPC ........ *H01L 27/2481* (2013.01); *H01L 27/1157* (2013.01); *H01L 27/11273* (2013.01); *H01L 27/11524* (2013.01); *H01L 27/11556* (2013.01); *H01L 27/11582* (2013.01); *H01L 27/249* (2013.01); *H01L 27/2454* (2013.01); *H01L 29/1033* (2013.01); *H01L 29/42356* (2013.01); *H01L 29/66666* (2013.01); *H01L 29/7827* (2013.01); *H01L 29/7889* (2013.01); *H01L 29/7926* (2013.01); *H01L 29/4925* (2013.01); *H01L 29/4983* (2013.01); *H01L 45/04* (2013.01); *H01L 45/1226* (2013.01); *H01L 45/146* (2013.01)

(58) Field of Classification Search
CPC .................. H01L 27/11273; H01L 27/11556; H01L 27/1157; H01L 27/11582; H01L 29/7889; H01L 29/7926
USPC ........................................... 257/74, 288, 390
See application file for complete search history.

(56) References Cited

U.S. PATENT DOCUMENTS

| | | | |
|---|---|---|---|
| 5,915,167 | A | 6/1999 | Leedy |
| 7,005,350 | B2 | 2/2006 | Walker et al. |

(Continued)

FOREIGN PATENT DOCUMENTS

| | | |
|---|---|---|
| KR | 20100109745 A | 10/2010 |
| KR | 20110021444 A | 3/2011 |
| WO | WO02/15277 A2 | 2/2002 |

OTHER PUBLICATIONS

International search report and written opinion received in connection with international application No. PCT/US2015/019431; mailed Jun. 17, 2015.

(Continued)

*Primary Examiner* — Matthew E Warren
(74) *Attorney, Agent, or Firm* — The Marbury Law Group PLLC

(57) ABSTRACT

A device is disclosed including one or more field effect transistors, each field effect transistor including: an elongated drain contact line including an electrically conductive material extending along a first horizontal direction; a drain including a first conductivity type semiconductor region overlaying the drain contact line; a source including a the first conductivity type semiconductor region located above the drain; and a gate extending vertically between the drain and the source. Each field effect transistor may include a first channel and a second channel, each including a second conductivity type

38 Claims, 19 Drawing Sheets

(51) Int. Cl.
- *H01L 29/788* (2006.01)
- *H01L 27/112* (2006.01)
- *H01L 29/792* (2006.01)
- *H01L 29/423* (2006.01)
- *H01L 29/10* (2006.01)
- H01L 45/00 (2006.01)
- H01L 29/49 (2006.01)

(56) References Cited

U.S. PATENT DOCUMENTS

| | | | |
|---|---|---|---|
| 7,023,739 | B2 | 4/2006 | Chen et al. |
| 7,177,191 | B2 | 2/2007 | Fasoli et al. |
| 7,221,588 | B2 | 5/2007 | Fasoli et al. |
| 7,233,522 | B2 | 6/2007 | Chen et al. |
| 7,514,321 | B2 | 4/2009 | Mokhlesi et al. |
| 7,575,973 | B2 | 8/2009 | Mokhlesi et al. |
| 7,745,265 | B2 | 6/2010 | Mokhlesi et al. |
| 7,808,038 | B2 | 10/2010 | Mokhlesi et al. |
| 7,846,782 | B2 | 12/2010 | Maxwell et al. |
| 7,848,145 | B2 | 12/2010 | Mokhlesi et al. |
| 7,851,851 | B2 * | 12/2010 | Mokhlesi et al. ............. 257/326 |
| 8,008,710 | B2 | 8/2011 | Fukuzumi |
| 8,053,829 | B2 | 11/2011 | Kang et al. |
| 8,187,932 | B2 | 5/2012 | Nguyen et al. |
| 8,394,716 | B2 | 3/2013 | Hwang et al. |
| 8,520,425 | B2 | 8/2013 | Xiao et al. |
| 2003/0062574 | A1 | 4/2003 | Hsieh |
| 2007/0210338 | A1 | 9/2007 | Orlowski |
| 2007/0252201 | A1 | 11/2007 | Kito et al. |
| 2009/0194813 | A1 | 8/2009 | Fujimoto |
| 2009/0230449 | A1 | 9/2009 | Sakaguchi et al. |
| 2010/0013049 | A1 | 1/2010 | Tanaka et al. |
| 2010/0044778 | A1 | 2/2010 | Seol |
| 2010/0112769 | A1 | 5/2010 | Son et al. |
| 2010/0120214 | A1 | 5/2010 | Park et al. |
| 2010/0155810 | A1 | 6/2010 | Kim et al. |
| 2010/0155818 | A1 | 6/2010 | Cho |
| 2010/0181610 | A1 | 7/2010 | Kim et al. |
| 2010/0207195 | A1 | 8/2010 | Fukuzumi et al. |
| 2010/0254191 | A1 | 10/2010 | Son et al. |
| 2010/0320528 | A1 | 12/2010 | Jeong et al. |
| 2011/0031546 | A1 | 2/2011 | Uenaka et al. |
| 2011/0076819 | A1 | 3/2011 | Kim et al. |
| 2011/0133606 | A1 | 6/2011 | Yoshida et al. |
| 2011/0169071 | A1 | 7/2011 | Uenaka |
| 2011/0266606 | A1 | 11/2011 | Park et al. |
| 2012/0001247 | A1 | 1/2012 | Alsmeier |
| 2012/0001249 | A1 | 1/2012 | Alsmeier |
| 2012/0001250 | A1 | 1/2012 | Alsmeier |
| 2012/0147648 | A1 | 6/2012 | Scheuerlein |
| 2012/0161094 | A1 | 6/2012 | Huo et al. |
| 2012/0241826 | A1 | 9/2012 | Satoh et al. |
| 2013/0264631 | A1 | 10/2013 | Alsmeier et al. |
| 2013/0313627 | A1 | 11/2013 | Lee |
| 2014/0124729 | A1 | 5/2014 | Hwang et al. |

OTHER PUBLICATIONS

U.S. Appl. No. 14/136,103, filed Dec. 20, 2013, Takaki.
U.S. Appl. No. 14/224,290, filed Mar. 25, 2014, Takaki.
U.S. Appl. No. 14/150,162, filed Jan. 8, 2014, Takaki et al.
Invitation to Pay Additional Search Fees issued in PCT Application No. PCT/US13/41410, mailed Sep. 9, 2013.(6 pp.).
International Search Report & Written Opinion, PCT/US2011/042566, Jan. 17, 2012 (30 pp.).
Invitation to Pay Additional Fees & Partial International Search Report, PCT/US2011/042566, Sep. 28, 2011. (7 pp.).
Endoh, T. et al., titled "Novel Ultra High Density Memory With A Stacked-Surrounding Gate Transistor (S-SGT) Structured Cell", IEDM Proc. (2001) 33-36.
Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.
Kimura, Masahide "3D Cells Make Terabit NAND Flash Possible," Nikkei Electronics Asia, Sep. 17, 2009, 6pgs.
Maeda et al., "Multi-Stacked 1G Cell/Layer Pipe-Shaped BiCS Flash Memory," 2009 Symposium on VLSI Technology Digest of Technical Papers, pp. 22-23.
Tanaka et al., "Bit-Cost Scalable Technology for Low-Cost and Ultrahigh-Density Flash Memory," Toshiba Review, vol. 63, No. 2, 2008, pp. 28-31.

* cited by examiner

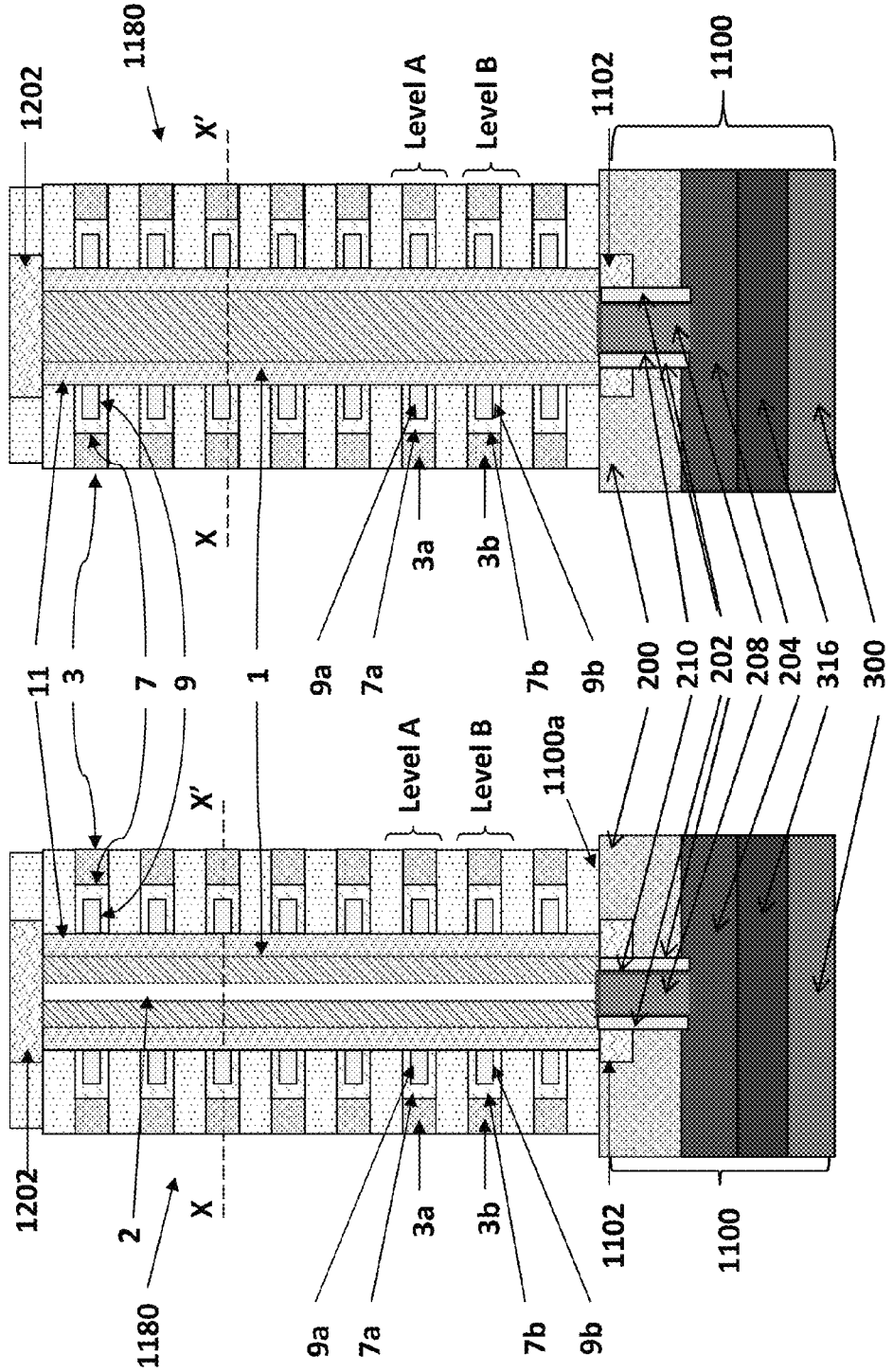

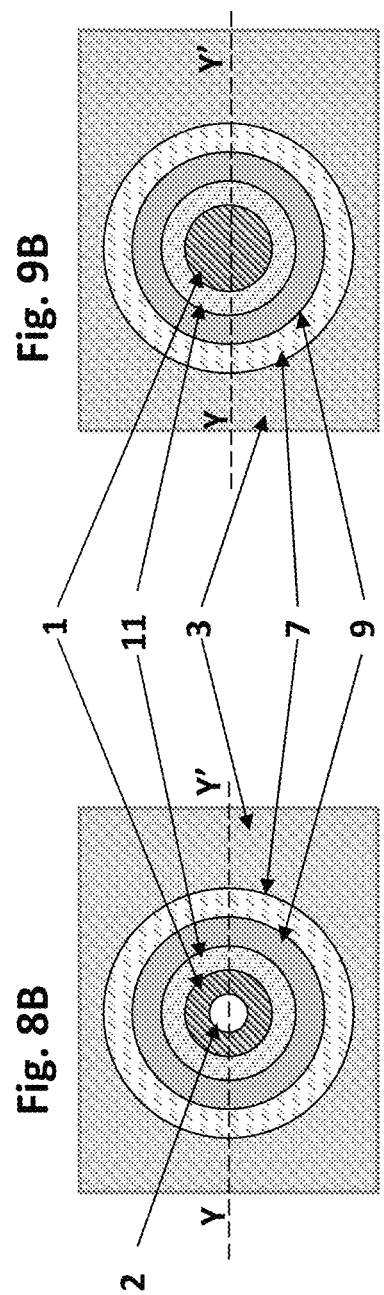

DUAL CHANNEL VERTICAL FIELD EFFECT TRANSISTOR INCLUDING AN EMBEDDED ELECTRODE

FIELD

The present invention relates generally to the field of semiconductor devices and specifically to vertical restive random access memory (ReRAM) devices other three dimensional devices and methods of making thereof.

BACKGROUND

One example of non-volatile memory uses variable resistance memory elements that may be set to either low or high resistance states, and can remain in that state until subsequently re-set to the initial condition. The variable resistance memory elements are individually connected between two orthogonally extending conductors (typically bit and word lines) where they cross each other in a two-dimensional array. The state of such a memory element is typically changed by proper voltages being placed on the intersecting conductors. An example of an array of variable resistive elements and associated diodes is given in U.S. Patent Application Publication No. US 2009/0001344.

SUMMARY

One embodiment relates to device including one or more field effect transistors, each field effect transistor including: an elongated drain contact line including an electrically conductive material extending along a first horizontal direction; a drain including a first conductivity type semiconductor region overlaying the drain contact line; a source including a the first conductivity type semiconductor region located above the drain; and a gate extending vertically between the drain and the source. The gate is elongated along a second horizontal direction transverse to the first horizontal direction; the gate includes a first vertical side and an opposing second vertical side, each vertical side contacting a gate insulating material; the gate includes a top portion adjacent to the source and electrically insulated from the source by a gate top isolation layer of insulating material; the gate includes a bottom portion adjacent to the drain and electrically insulated from the drain by a gate bottom isolation layer of insulating material. Each field effect transistor may further include a first channel and a second channel, each including a second conductivity type semiconductor region different from the first conductivity type. In some embodiments, the first channel extends vertically from the drain to the source and is located on the first vertical side of the gate and is electrically insulated from the gate by the gate insulating material contacting the first vertical side of the gate; and the second channel extends vertically from the drain to the source and is located on the second vertical side of the gate and is electrically insulated from the gate by the gate insulating material contacting the second vertical side of the gate.

Another embodiment includes a method of making one or more field effect transistors, the method including: providing a drain contact level including a plurality of substantially parallel elongated drain contact lines each extending along a first horizontal direction, a respective layer of semiconductor drain material having a first conductivity type located on each respective one of the drain contact lines, and an electrically insulating material filling horizontal spaces between the elongated drain contact lines and the respective layers of semiconductor drain material; forming a gate bottom isolation layer of insulating material over the drain contact level; forming a gate layer over the gate bottom isolation layer; forming a gate top isolation layer of insulating material over the gate layer; patterning the gate top isolation layer, the gate layer, and the gate bottom isolation layer to form a plurality of elongated gate lines extending along a second horizontal direction transverse to the first horizontal direction, where each elongated gate line includes: a top insulating layer; a gate body layer; and a bottom insulating later. The method may further include: forming gate insulating material on lateral sides of the elongated gate lines; and forming a conformal layer of channel semiconductor material on the gate lines and the drain material, the channel semiconductor material having a second conductivity type opposite the first conductivity type, where the conformal layer defines troughs between and extending along the second horizontal direction between the gate lines.

Another embodiment includes a vertical channel field effect transistor device, including: a substrate; an elongated contact line located above the substrate; a gate located above the substrate and above the contact line; one of a source or a drain located between the gate and the substrate and in electrical contact with the elongated contact line; another one of the source or the drain located above the gate; a first channel located adjacent to a first lateral side of the gate; a second channel located adjacent to a second lateral side of the gate opposite to the first lateral side; a first gate insulating layer located between the first channel and the first lateral side of the gate; and a second gate insulating layer located between the second channel and the second lateral side of the gate. Lower portions of the first and the second channels contact the one of the source or the drain located between the gate and the substrate. Upper portions of the first and the second channels contact the another one of the source or the drain located above the gate.

BRIEF DESCRIPTION OF THE DRAWINGS

FIG. 7A-7K show perspective views of a process for fabricating an array of dual channel transistor devices.

FIGS. 8A-8B are respectively side cross sectional and top cross sectional views of a NAND string of one embodiment. FIG. 8A is a side cross sectional view of the device along line Y-Y' in FIG. 8B, while FIG. 8B is a side cross sectional view of the device along line X-X' in FIG. 8A.

FIG. 9A-9B are respectively side cross sectional and top cross sectional views of a NAND string of another embodiment. FIG. 9A is a side cross sectional view of the device along line Y-Y' in FIG. 9B, while FIG. 9B is a side cross sectional view of the device along line X-X' in FIG. 9A.

DETAILED DESCRIPTION

Embodiments of the present invention will be described below with reference to the accompanying drawings. It should be understood that the following description is intended to describe exemplary embodiments of the invention, and not to limit the invention.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

Embodiments of the invention provide a monolithic, three dimensional array of memory devices, such as an array of ReRAM devices or vertical NAND strings. The memory cells of such devices may be vertically oriented, such that at least one memory cell is located over another memory cell. The array allows vertical scaling of the devices to provide a higher density of memory cells per unit area of silicon or other semiconductor material.

Figure 1:
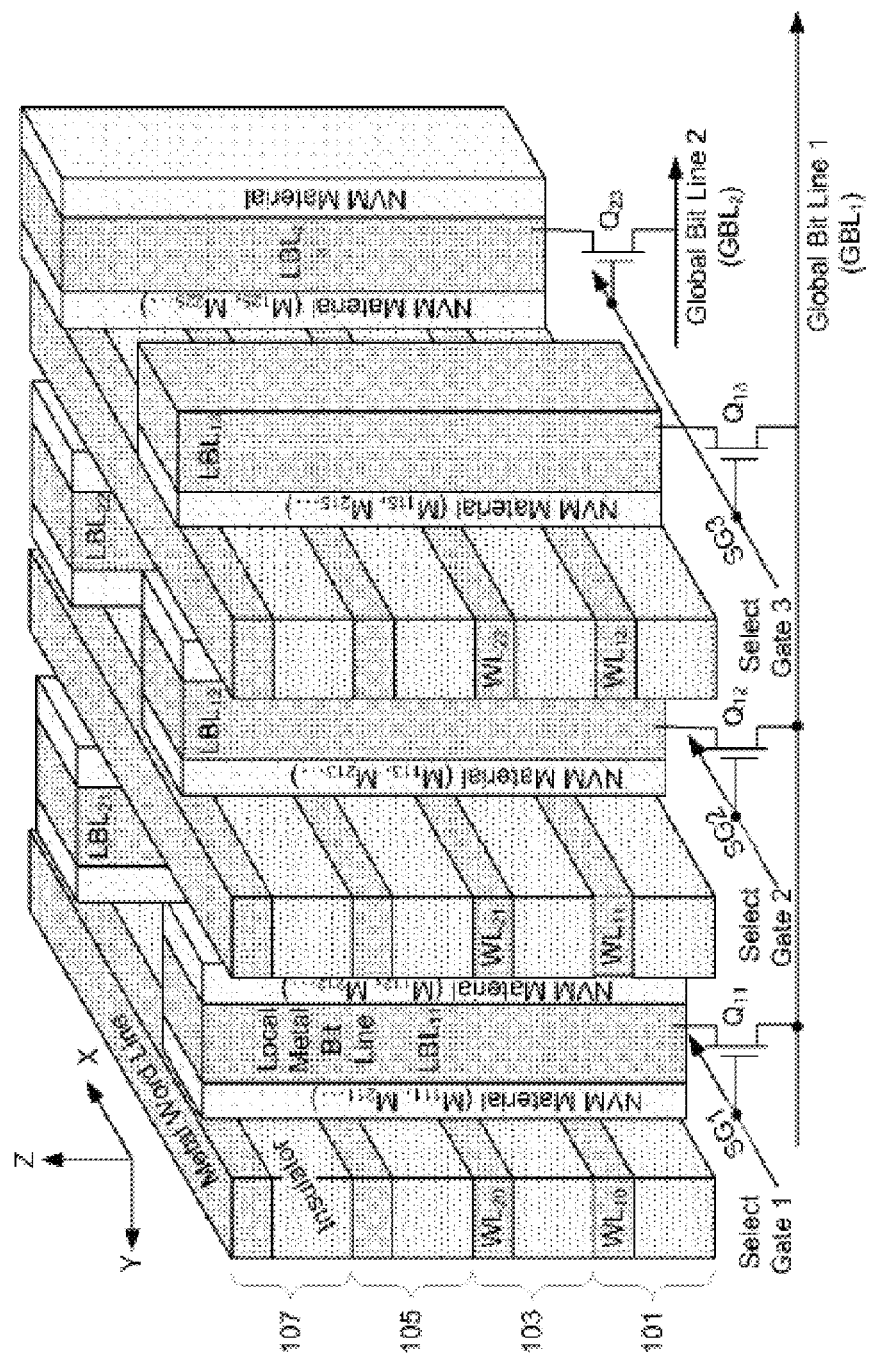
FIG. 1 shows a perspective view of a three dimensional ReRAM memory device.

FIG. 1 shows one example semiconductor structure for implementing a vertically oriented 3D ReRAM memory element, of the type described in U.S. Pat. Pub. No. 2012/0147648, published Jun. 14, 2012 and incorporated by reference herein in its entirety. The ReRAM device is configured for use of non-volatile memory element ("NVM") material that is non-conductive when first deposited. Since the material is initially non-conductive, there is no necessity to isolate the memory elements at the cross-points of the word and bit lines from each other. Several memory elements may be implemented by a single continuous layer of material, which in the case of FIG. 1 are strips of NVM material oriented vertically along opposite sides of the vertical bit lines in the y-direction and extending upwards through all the planes in the z-direction. A significant advantage of the structure of FIG. 1 is that all word lines and strips of insulation under them in a group of planes may be defined simultaneously by use of a single mask, thus greatly simplifying the manufacturing process.

Referring to FIG. 1, a small part of four planes (e.g., drive levels separated in the z-direction) 101, 103, 105 and 107 of the three-dimensional array are shown. All of the planes have the same horizontal pattern of conductive, insulating and NVM materials. In each plane, electrically conductive (e.g., metal) word lines ($WL_{zy}$) are elongated in the x-direction and spaced apart in the y-direction. Each plane includes a layer of insulating material (e.g., a dielectric) that isolates its word lines from the word lines of the plane below it or, in the case of plane 101, of the substrate circuit components below it. In some embodiments, the word lines $WL_{zy}$ for a fixed value of y form a stack of alternating layers that may extend beyond the memory device into a contact area (not shown).

Extending through each plane is a collection of electrically conductive (e.g., metal) local bit line (LBL) "pillars" elongated in the vertical z-direction and forming a regular array in the x-y planes.

Figure 4:
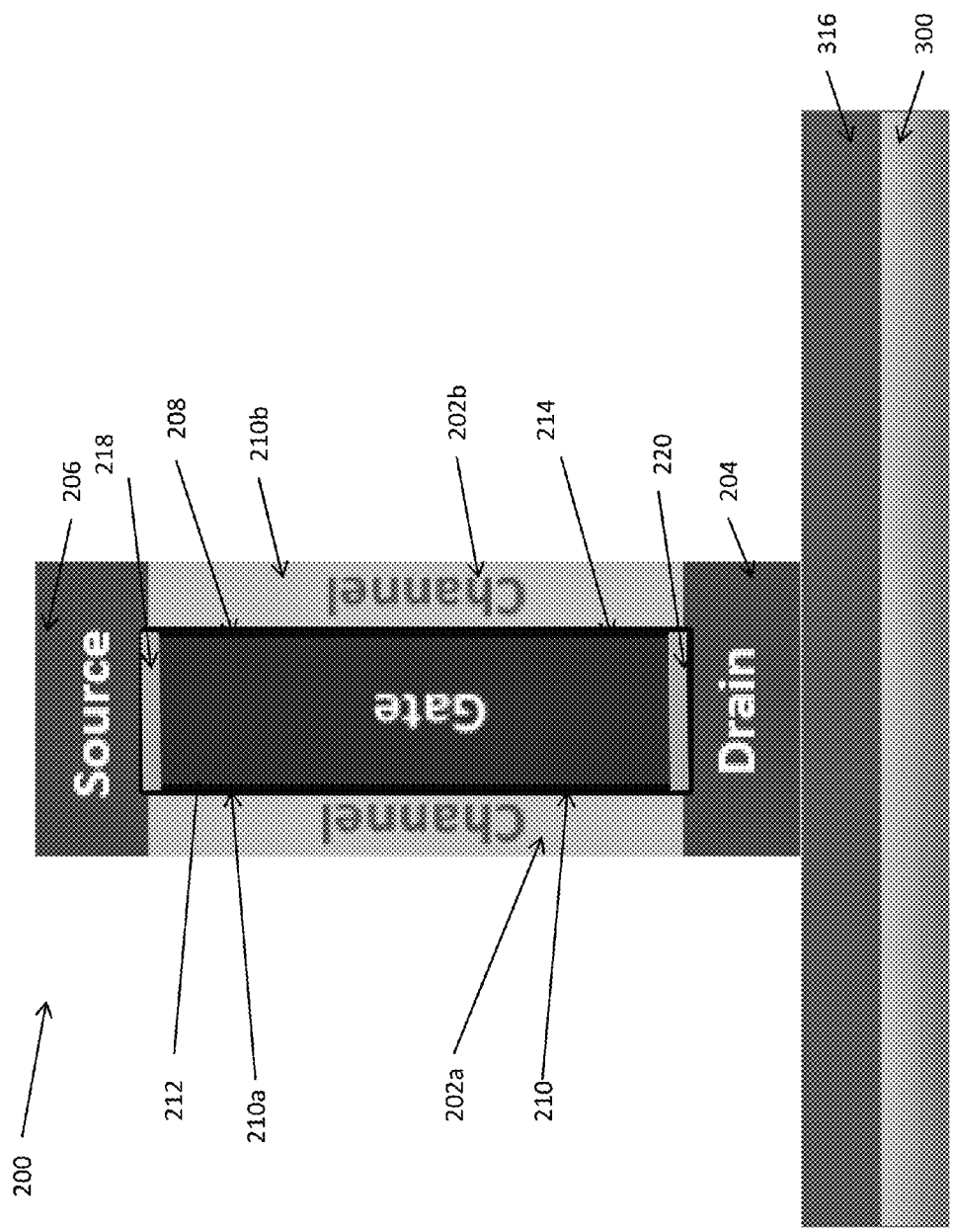
FIG. 4 shows a side cross sectional view of a dual channel transistor device.
Figure 5:
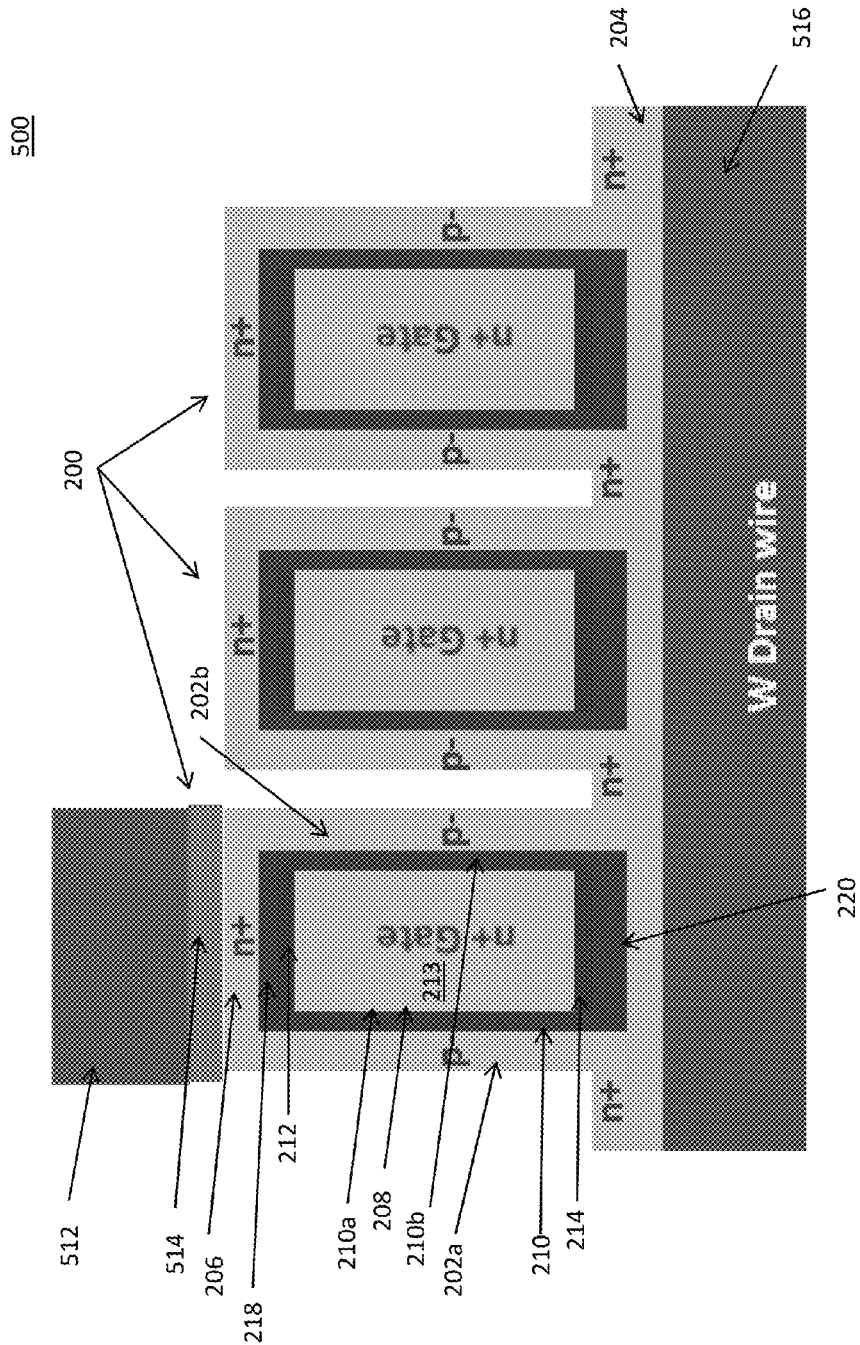
FIG. 5 shows a side cross sectional view of three dual channel transistor devices.
Figure 6:
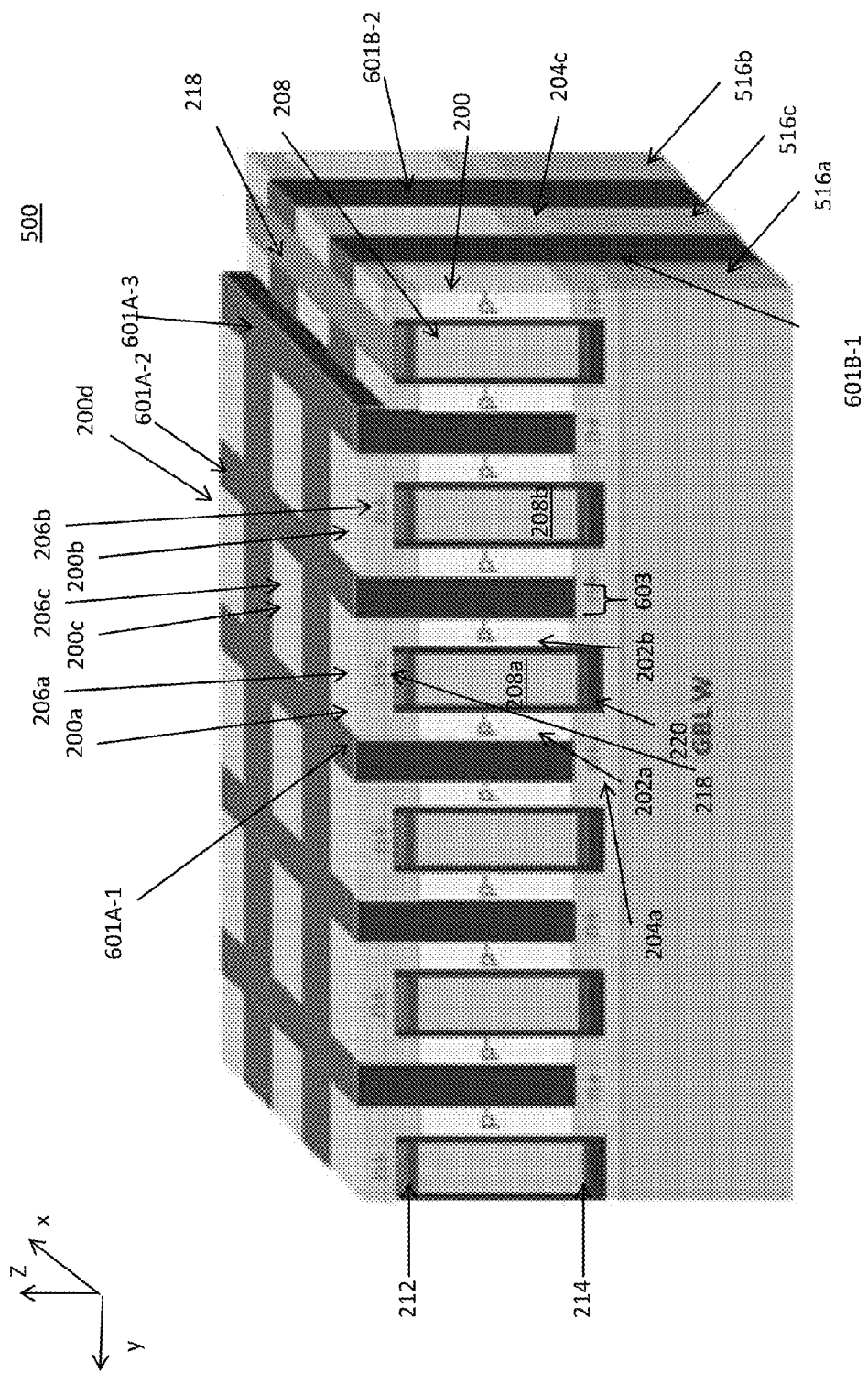
FIG. 6 shows a perspective view of an array of dual channel transistor devices. For clarity, the top source layer over the rightmost line of transistors along the x direction has been omitted to show the common gate isolation layer for these transistors.

Each bit line pillar is connected to one of a set of underlying global bit lines (GBL) (e.g., located in the silicon substrate) running in the y-direction at the same pitch as the pillar spacing through the select devices ($Q_{xy}$) formed in the substrate whose gates are driven by the row select lines (SG) elongated in the x-direction, which are also formed in the substrate. The select devices $Q_{xy}$ may be transistors of the type described in detail herein, e.g., as shown in FIGS. 4-6. Also fabricated in the substrate but not shown in FIG. 1 are sense amplifiers, input-output (I/O) circuitry, control circuitry, and any other necessary peripheral circuitry. There is one row select line (SG) for each row of local bit line pillars in the x-direction and one select device (Q) for each individual local bit line (LBL).

Each vertical strip of NVM material is sandwiched between the vertical local bit lines (LBL) and a plurality of word lines (WL) vertically stacked in all the planes. Preferably the NVM material is present between the local bit lines (LBL) in the x-direction. A memory storage element (M) is located at each intersection of a word line (WL) and a local bit line (LBL). In the case of a metal oxide (e.g., nickel oxide or copper oxide) for the memory storage element material, a small region of the NVM material between an intersecting local bit line (LBL) and word line (WL) is controllably alternated between more conductive (set) and less conductive (reset) states by appropriate voltages applied to the intersecting lines.

Figure 2:
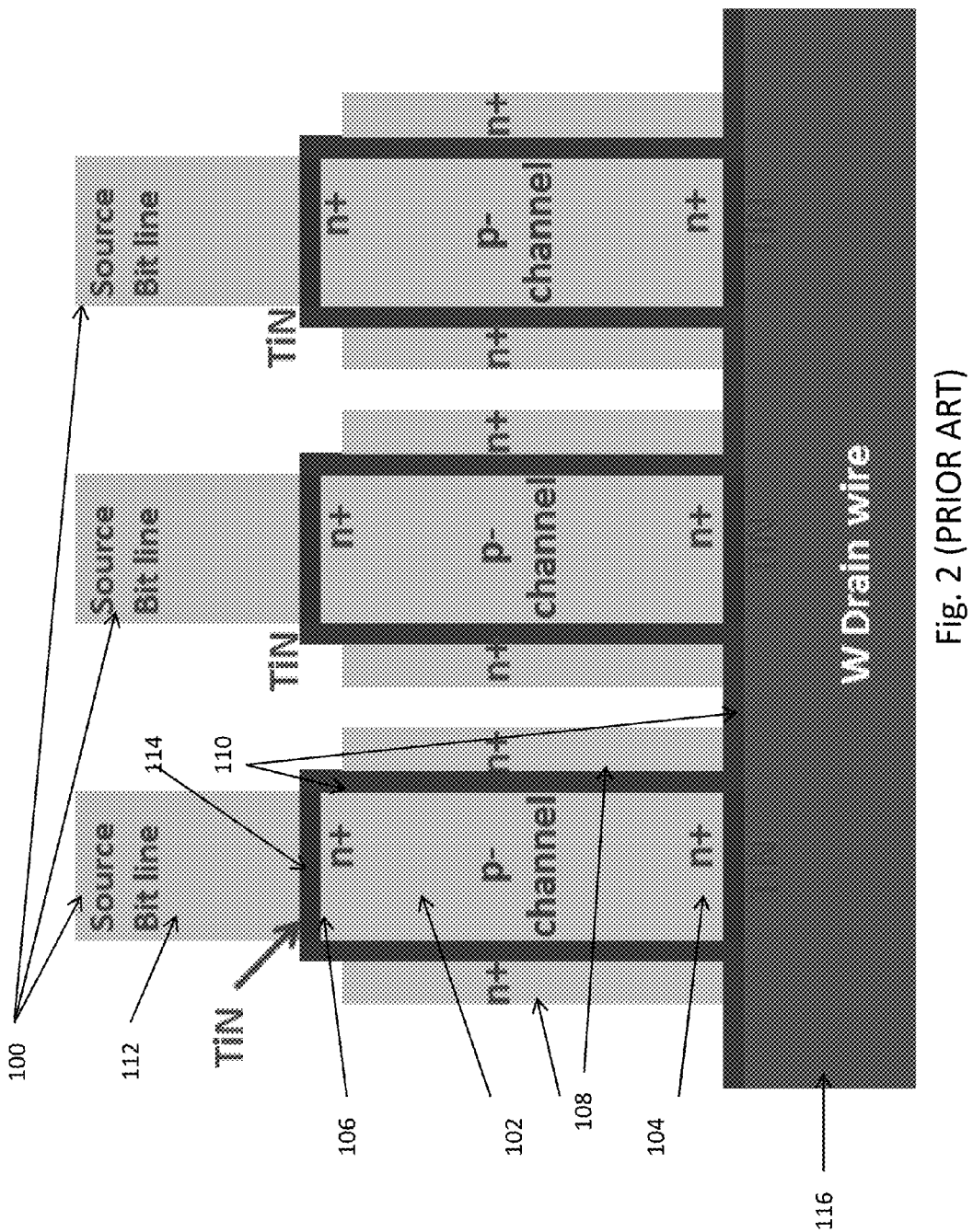
FIG. 2 shows a side cross sectional view of three vertical thin film transistor devices.

Referring to FIG. 2, in some embodiments, the select devices (Q) may be formed as vertically oriented single channel transistors 100 (e.g., field effect transistors). Each transistor 100 includes a single channel 102 extending vertically from drain region 104 to a source region 106 (also referred to for conciseness, as drain 104 and source 106). The source 106 and drain 104 may be made of a semiconductor material of a first conductivity type (e.g., n-type). The channel 102 may be made of a semiconductor material with second conductivity type different from the first conductivity type (e.g., p-type). In each device 100, two gates 108 are located adjacent to each lateral side of the channel 102. The gates 108 may be made of a heavily doped semiconductor material having a suitable conductivity type (e.g., a n-type material as shown). The gates 108 are electrically insulated from the channel 102, source 106 and drain 104 by a gate insulating material 110 (e.g., an oxide or any other suitable insulating material). In some embodiments, the gates 108 comprise or are in electrical contact with the select gates (e.g., SG1, SG2, SG3) of the ReRAM memory device of FIG. 1

For each transistor 100, the source 106 is in electrical contact with a source contact electrode 112 (e.g., a line of electrically conductive material such as tungsten). As shown, the source contact electrode 112 comprises or is in contact with a local bit line (LBL) of the ReRAM memory device shown in FIG. 1. In the embodiment shown, a contact layer 114 of TiN or another barrier material is included between the source 106 and the source contact electrode 112.

For each transistor 100, the drain 104 is in electrical contact with a drain contact electrode 116 (e.g., a line of electrically conductive material such as tungsten). In the embodiment shown, a contact layer 114 of TiN or another barrier material is included between the drain 104 and the drain contact electrode 116. As shown in FIG. 1, the drain contact electrode 116 is a common drain line shared by each of the plurality of transistors 100. As shown the drain contact electrode 116 comprises or is in electrical contact with a global bit line (e.g., GBL₁) of the ReRAM memory device of FIG. 1.

FIG. 2 shows an embodiment that includes three transistors 100. However, it is to be understood that in other embodiments an number of transistors 100 may be used, e.g., 1, 2, 3, or more, such as 1-10, 1-100, 1-1,000, 1-10,000, 1-100,000, 1-1,000,000, 1-1,000,000,000 or any subrange of any of the preceding ranges.

Figure 3:
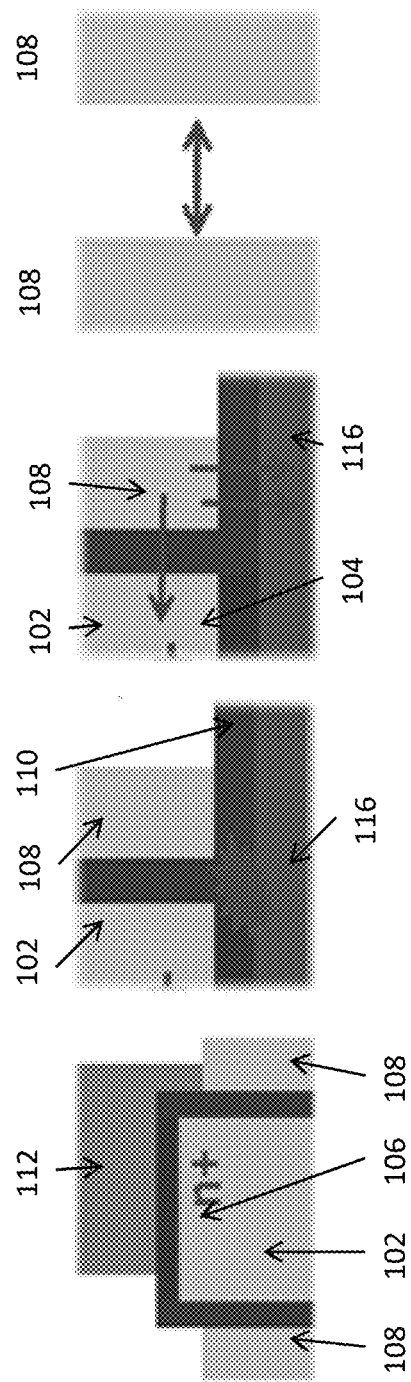
FIGS. 3A-D show detailed views of portions of the vertical thin film transistor devices of FIG. 2 illustrating fabrication errors.

FIGS. 3A-3D illustrate a number of fabrication errors that may occur in single channel transistors of the type shown in FIG. 2. In FIG. 3A the source contact electrode 112 is misaligned with the source 106, resulting in an electrical short between the source contact electrode 112 and the gate 108. Similarly, a high current leak from the gate 108 and the drain 104 may occur because overlap of the gate 108, source 106, and drain 104 is difficult to control and/or the bottom gate isolation layer and gate oxide 110 may be thin.

FIG. 3B illustrates a breakdown in the gate insulating material 110 at a corner region (a "hot spot"), resulting in current leakage from the gate 108. FIG. 3C illustrates current leakage from the gate 108 though thin portions of the gate isolation material 110. FIG. 3D illustrates current leakage between gates 108 of adjacent devices 100.

In some embodiments, each channel 102 is a pillar formed through two etching steps (e.g., using a first and a second dry etching step to define the pillar in the x and y directions respectively), and etching damage during this process may result in a lower on-current for the transistor 100.

In some embodiments, the overlay of the gate 108 on the source 106 or drain 104 is controlled using an etching process without an etch pit density measurement. As a result, the etch rate distribution on-wafer and wafer-by-wafer will disturb the gate 108 on the source 106 or drain 104 which may result in a lower on-current for the transistor 100.

The following describes embodiments of devices including one or more dual channel transistors 200 (e.g., field effect transistors). Some embodiments of the dual channel transistors 200 may reduce or eliminate some or all of the disadvantageous effects experienced by single channel transistors as illustrated in FIGS. 3A-3D.

Referring to FIG. 4, one embodiment of the dual channel transistor 200 is a vertically oriented field effect transistor. The dual channel transistor 200 includes a first channel 202a and a second channel 202b extending vertically from a drain region 204 to a source region 206 (also referred to for conciseness, as drain 204 and source 206). The source 206 and drain 204 may be made of a semiconductor material of a first conductivity type (e.g., p-type). The first and second channels 202a and 202b may be made of a semiconductor material having a second conductivity type different from the first conductivity type (e.g., n-type).

A gate 208 extends between the source 206 and drain 204. The gate 208 includes a first vertical side 210a and an opposing second vertical side 210b, each vertical side contacting a gate insulating material 210. The gate 208 includes a top portion 212 adjacent to the source 206 and electrically insulated from the source by a gate top isolation layer of insulating material 218. The gate 208 includes a bottom portion 214 adjacent to the drain 204 and electrically insulated from the drain 204 by a gate bottom isolation layer of insulating material 220. Accordingly, as shown, the first channel 202a extends vertically from the drain 204 to the source 206 and is located on the first vertical side 210a of the gate 208 and is electrically insulated from the gate 208 by the gate insulating 210 material contacting the first vertical side 210a of the gate 208. The second channel 202b extends vertically from the drain 204 to the source 206 and is located on the second vertical side 210b of the gate 208 and is electrically insulated from the gate 208 by the gate insulating material contacting the second vertical side 210b of the gate 208.

In some embodiments, the transistor 200 includes a substrate 300 with an elongated contact line 316 (e.g., drain line) formed on the substrate 300. In some embodiments, the elongated contact line 316 is located below and is in electrical contact with the drain region 204. In some embodiments, the elongated contact line 316 extends in a direction transverse to the gate 208.

Although FIG. 4 shows an embodiment with the source 206 located above the drain 204, it is to be understood that in various embodiments this orientation may be reversed such that the drain 204 is located below the source 206.

FIG. 5 shows an embodiment of a device 500 that includes three dual channel transistors 200 of the type shown in FIG. 4. However, it is to be understood that in other embodiments an number of transistors 200 may be used, e.g., 1, 2, 3, or more, such as 1-10, 1-100, 1-1,000, 1-10,000, 1-100,000, 1-1,000,000, 1-1,000,000,000 or any subrange of any of the preceding ranges.

The device 500 includes elongated drain contact line 516 including an electrically conductive material extending along a first horizontal direction (as shown the left-right direction). As described above, each of the dual channel transistors 200 is a vertically oriented field effect transistor. Each dual channel transistor 200 includes a first channel 202a and a second channel 202b extending vertically from a drain 204 to a source region 206. The drain 204 overlays the drain contact line 516, and the source 206 is positioned above the drain 204. The source region 206 and drain region 204 may be made of a semiconductor material of a first conductivity type (e.g., p-type). The first and second channels 202a and 202b may be made of a semiconductor material having a second conductivity type different from the first conductivity type (e.g., n-type).

For each transistor 200, the gate 208 extends between the source 206 and drain 204 and is elongated along a second horizontal direction transverse to the first horizontal direction (as shown the direction into and out of the page in FIG. 5). The gate 208 includes a first vertical side 210a and an opposing second vertical side 210b, each vertical side contacting a gate insulating material 210. The gate 208 includes a top portion 212 adjacent to the source 206 and electrically insulated from the source by a gate top isolation layer of insulating material 218. The gate 208 includes a bottom portion 214 adjacent to the drain 204 and electrically insulated from the drain 204 by a gate bottom isolation layer of insulating material 220. Accordingly, as shown, the first channel 202a extends vertically from the drain 204 to the source 206 and is located on the first vertical side 210a of the gate 208 and is electrically insulated from the gate 208 by the gate insulating material 210 contacting the first vertical side 210a of the gate 208. The second channel 202b extends vertically from the drain 204 to the source 206 and is located on the second vertical side 210b of the gate 208 and is electrically insulated from the gate 208 by the gate insulating material 210 contacting the second vertical side 210b of the gate 208.

In some embodiments, the top and bottom portions 212 and 214 of the gate 208 each include a layer of a metal such as Ti, W, etc. or a metal oxide or metal nitride such as TiN, WN, etc. and the gate 208 includes a middle portion 213 of a doped semiconductor material, such as doped polysilicon sandwiched between the layers of metal or metal nitride. Alternatively, the entire gate 208 may be made of a metal or metal nitride. In some embodiments, the source 206, drain 204 and first and the second channels 202a and 202b may include a doped semiconductor material, such as doped polysilicon.

In various embodiments, the elongated drain contact line 516 may be made of any suitable electrically conductive material such as W, Mo, Cr, a noble metal, or a metal silicide. Some embodiments may include a source contact line 512 in electrical contact with the source. In various embodiments, the source contact line 512 may be made of any suitable electrically conductive material such as W, Mo, Cr, a noble metal, or a metal silicide. In some embodiments, the source contact line 512 includes a metal, and a metal silicide contact 514 is located between the source 206 and the source contact line 512.

Although in the examples above, the first conductivity type is n-type and the second conductivity type is p-type, it is to be understood that in over embodiments the first conductivity type is p-type and the second conductivity type is n-type.

FIG. 6 shows a perspective view an embodiment of the device 500 of FIG. 5. The device 500 includes a 3×6 array of dual channel transistors 200 of the type shown in FIG. 4. However, it is to be understood that in other embodiments any number of transistors 200 in any suitable arrangement may be used.

As shown, the device 500 includes a plurality of two dimensional arrays (in the y-z plane) of dual channel transistors 200 of the type shown in FIGS. 4 and 5. These arrays repeat in the x-direction. As shown, a first transistor 200a and a second transistor 200b arranged along the y-direction share a common elongated drain contact line 516a and a common drain 204, but may have separate gates 208a, 208b. The respective gates 208a and 208b of the first and second transistors 200a and 200b are isolated from each other by electrically insulating fill material 601A. The electrically insulating fill material 601A fills a space 603 between the respective channel 202b and source 206a of the first transistor 200a and the respective channel 202a and source 206b of the second transistor 200b.

Transistors 200 arranged in a line along the x-direction share a common gate 208, but have separate respective drains 204 and drain contact lines 516 (e.g., 516a, 516b, 516c) that are electrically insulated from each other. For example, as shown, the first transistor 200a and a third transistor 200c share a common gate 208a. The drain 204a and drain contact line 516a of the first transistor 200a is electrically insulated from drain 204c and drain contact line 516c of the third transistor 200c by the electrically insulating fill material 601B. The electrically insulating fill material 601 also fills a space 603 between the respective channel 202a and source 206 of the first transistor 200a and the respective channel (not shown) and source 206c of the third transistor 200c.

The remaining transistors 200 are similarly configured, such that the device 500 includes a rectangular array of transistors 200 having lines of transistors arranged horizontally along x and y directions. Transistors 200 in each line along the y-direction each share a common elongated drain contact line 516 and a common drain 204 and have respective gates 208 that are electrically insulated from each other. Transistors 200 in each line along the x-direction each share a common gate 208, and have respective drains 204 and drain contact lines 516 that are electrically insulated from each other. For clarity, the top source layer over the rightmost line of transistors 200 along the x direction has been omitted to show the common gate 208 isolation layer 218 for these transistors 200.

In general, the resulting structure of each of the transistor 200 includes a first insulating isolation layer 601A-1 located adjacent to the first channel 202a, second insulating isolation layer 601A-2 located adjacent to the second channel 202b, a third insulating isolation layer 220 located below the gate 208 between the one of the source 206 or the drain 204 and the gate 208, a fourth insulating isolation layer 218 located above the gate 208 between the other one of the source 206 or the drain 204 and the gate 208. A fifth insulating isolation 601B-1 layer and a sixth insulating isolation layer 601B-2 are further provided and electrically separate the source 206, the first channel and the second channel (not shown) of transistor 200c from a respective source 206, first channel 202a and second channel 202b of at least two adjacent transistors 200a and 200d.

Some embodiments may include a three dimensional solid state memory device, and one or more of the transistor devices include a memory cell select transistor for the three dimensional solid state memory device. For example, in some embodiments, the transistors 200 may act as the select devices $Q_{xy}$ in the ReRAM device shown in FIG. 1. For example, each gate 208 may comprise or be in electrical contact with a select gate (SG) shown in FIG. 1. Each drain contact line 516 may comprise or be in electrical contact with a global bit line (GBL) shown in FIG. 1. Each source contact line 516 may include or be in electrical contact with a local bit line (LBL) shown in FIG. 1. The memory cells of FIG. 1 may be monolithically formed over the device 500.

In other embodiments each the transistors 200 may act as the select transistor for other types of devices, e.g., a NAND string memory cell in a vertical NAND memory device, as described in detail below with reference to FIGS. 8A-9B.

FIGS. 7A-7K illustrate a method of making one or more field effect transistors, such as transistors 200.

Figure 7A:
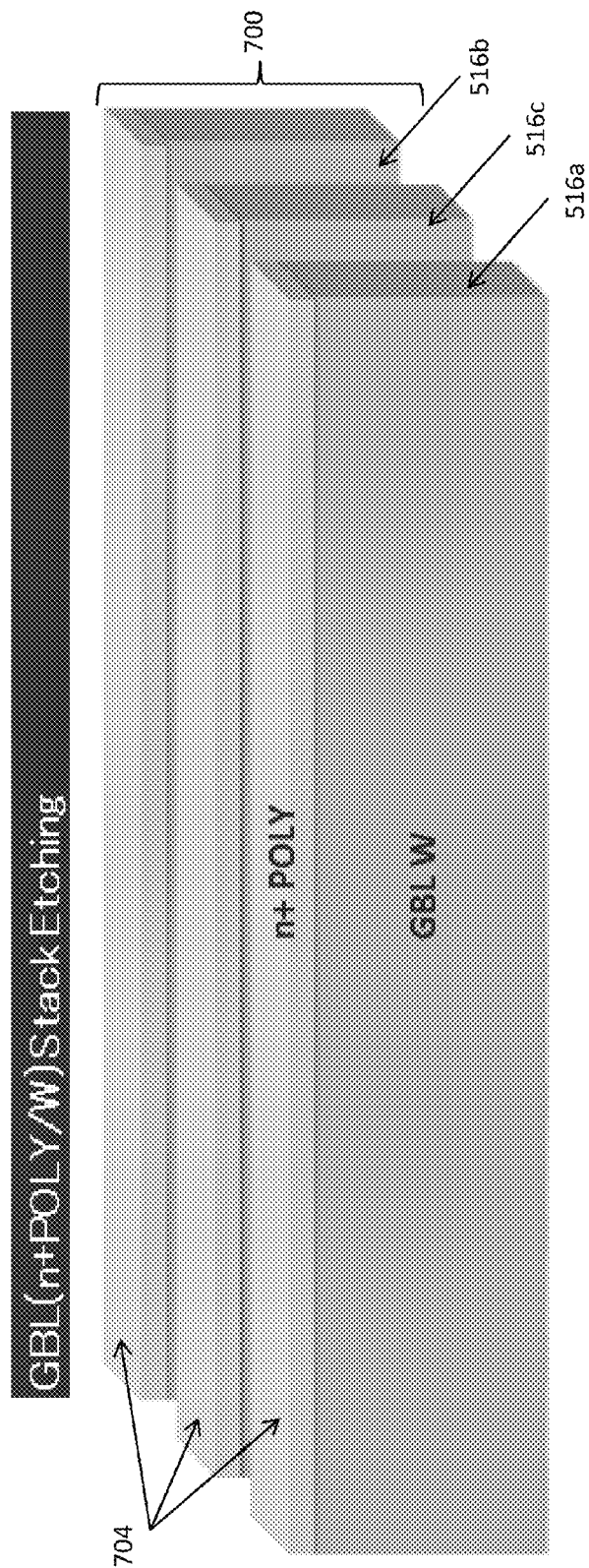
Figure 7B:
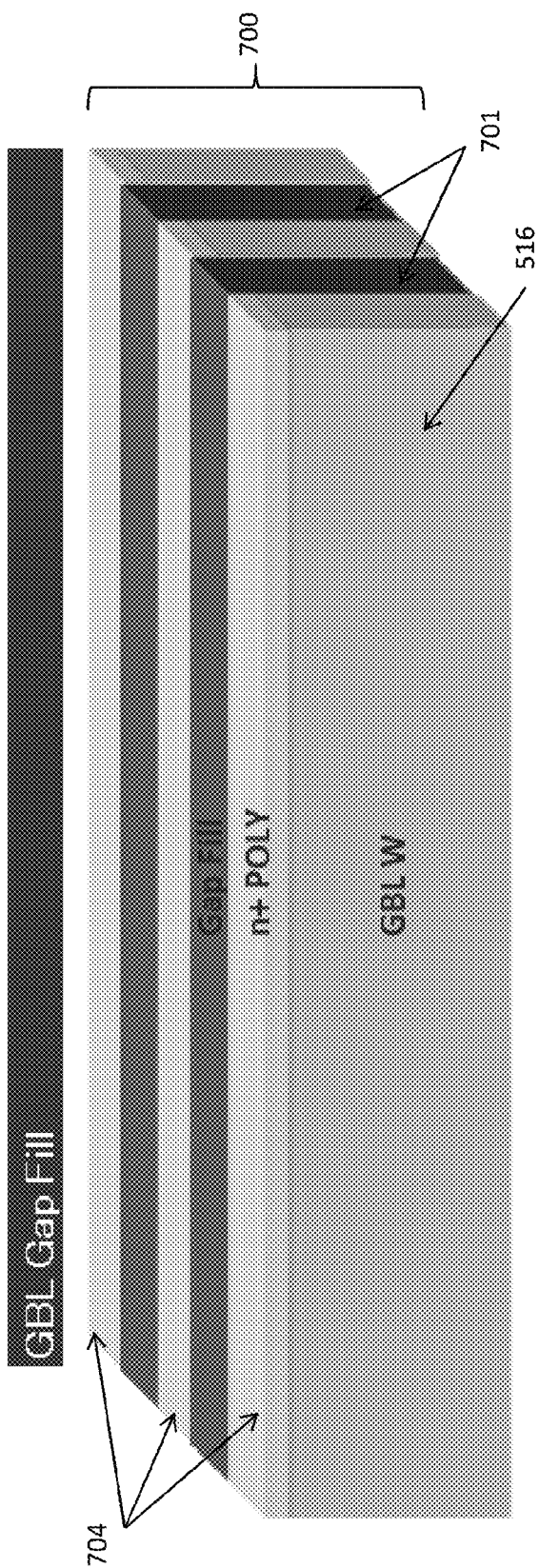

Referring to FIGS. 7A and 7B, a first step includes providing a drain contact level 700 comprising a plurality of substantially parallel elongated drain contact lines 516a-516c each extending along a first horizontal direction (the y-direction as shown), a respective layer of semiconductor drain material 704 (e.g., as shown polysilicon) having a first conductivity type located on each respective one of the drain contact lines 516, and an electrically insulating material 701 filling horizontal spaces between the elongated drain contact lines 516 and the respective layers of semiconductor drain material 704. In various embodiments the elongated drain contact lines 516 may include W, Mo, Cr, a noble metal, or a metal silicide.

Figure 7C:
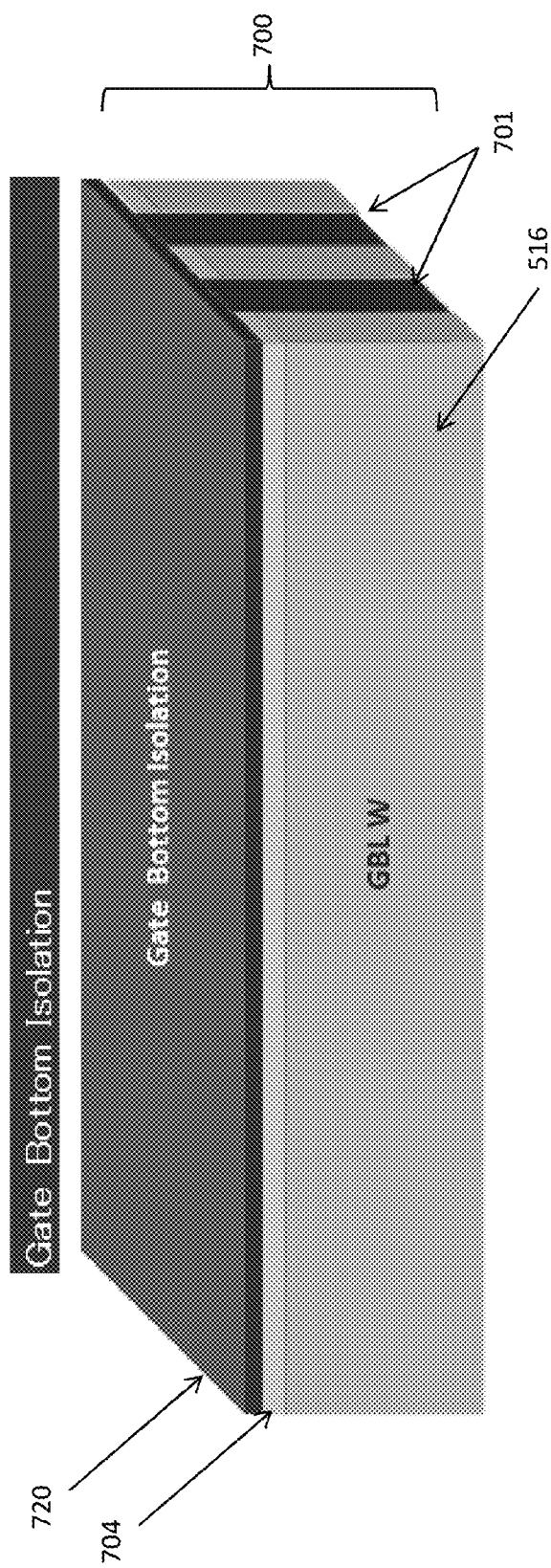

Referring to FIG. 7C, another step includes forming a gate bottom isolation layer 720 of insulating material over the drain contact level 700. For example, the insulating material may be, e.g., a silicon oxide material deposited using any suitable technique.

Figure 7D:
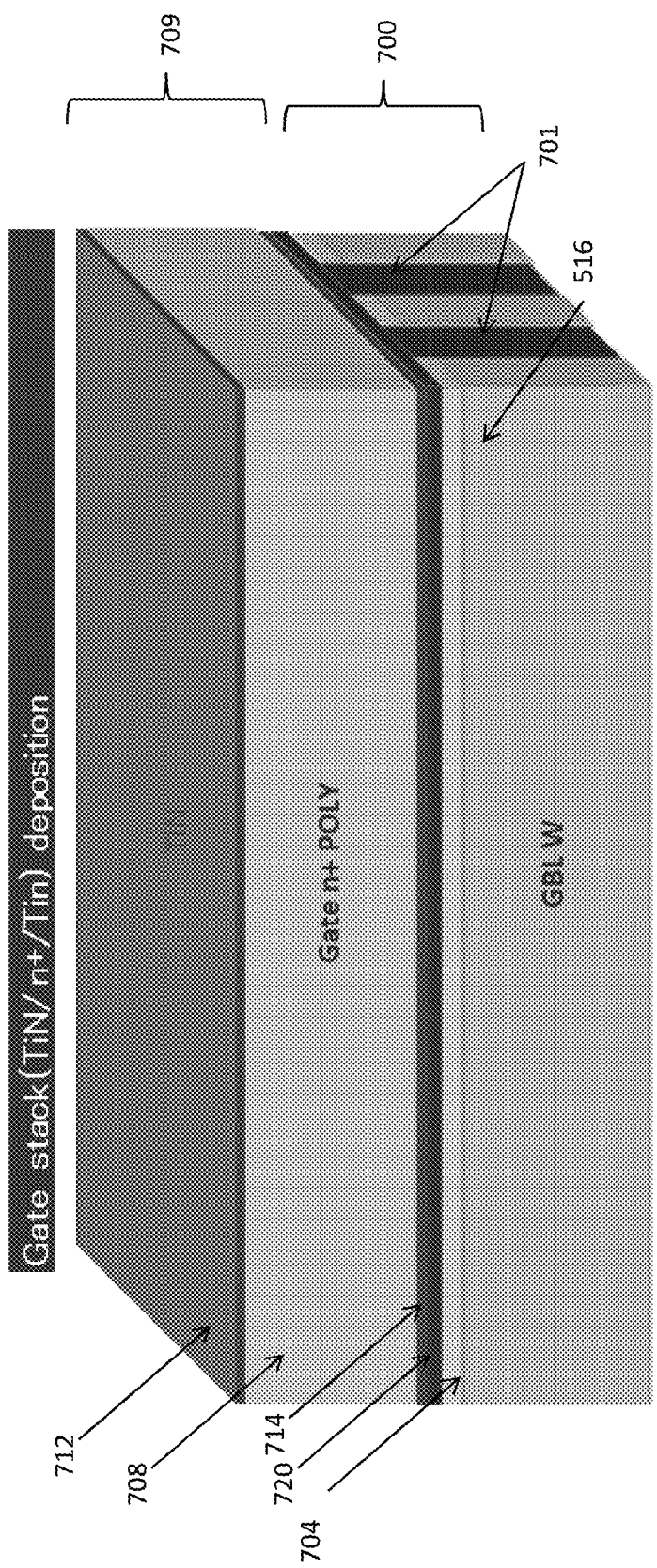
Figure 7E:
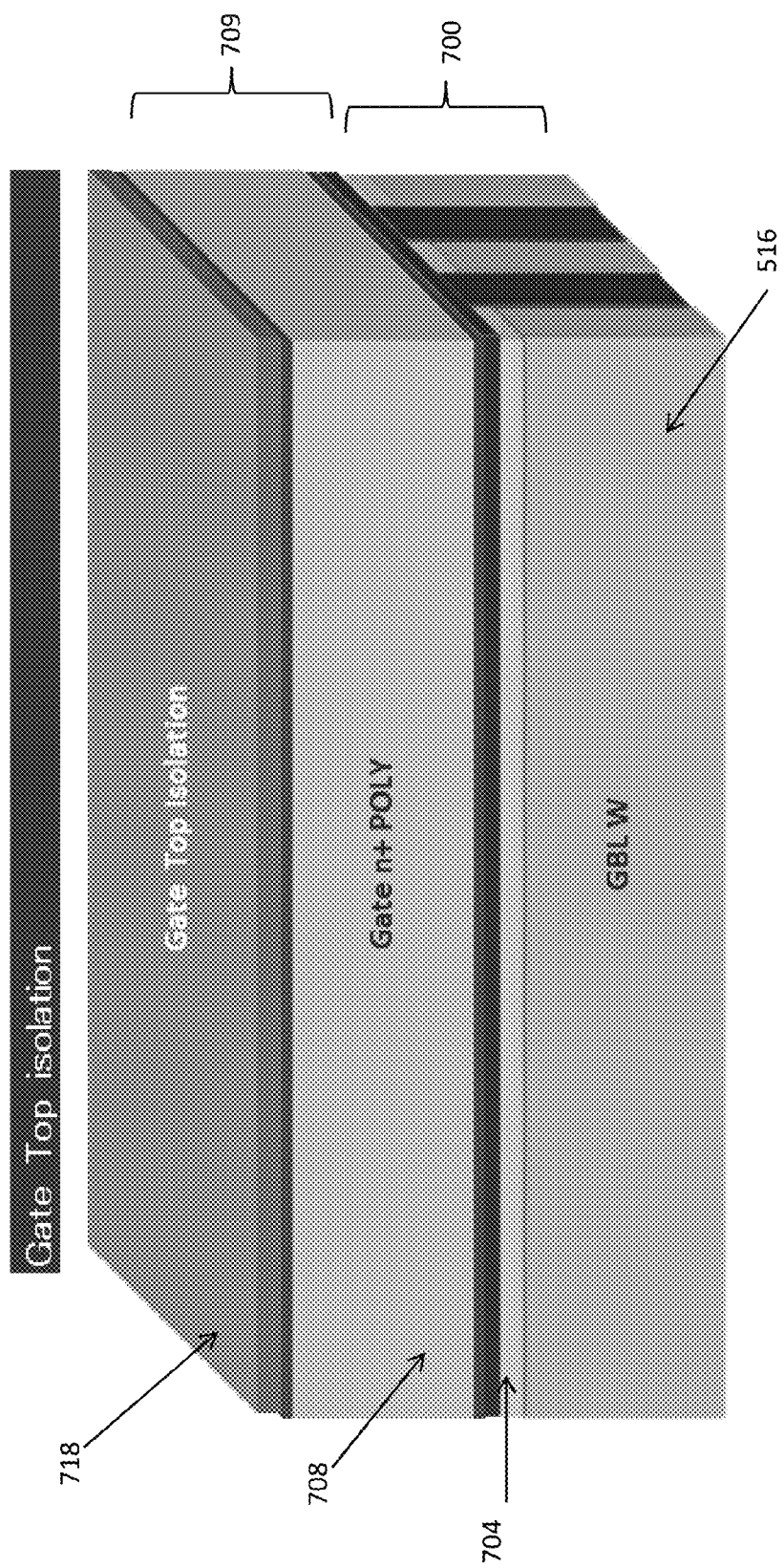

Referring to FIG. 7D, one are more gate layers 708 are formed. For example, the gate layer may comprise a stack 709 of TiN bottom layer 714, polysilicon semiconductor layer 708 and TiN top layer 712). Alternatively a single semiconductor or conductive (e.g., metal or metal nitride) gate layer may be used. Then, as shown in FIG. 7E, a gate top isolation layer 718 of insulating material is formed over the gate layer(s) 709.

Figure 7F:
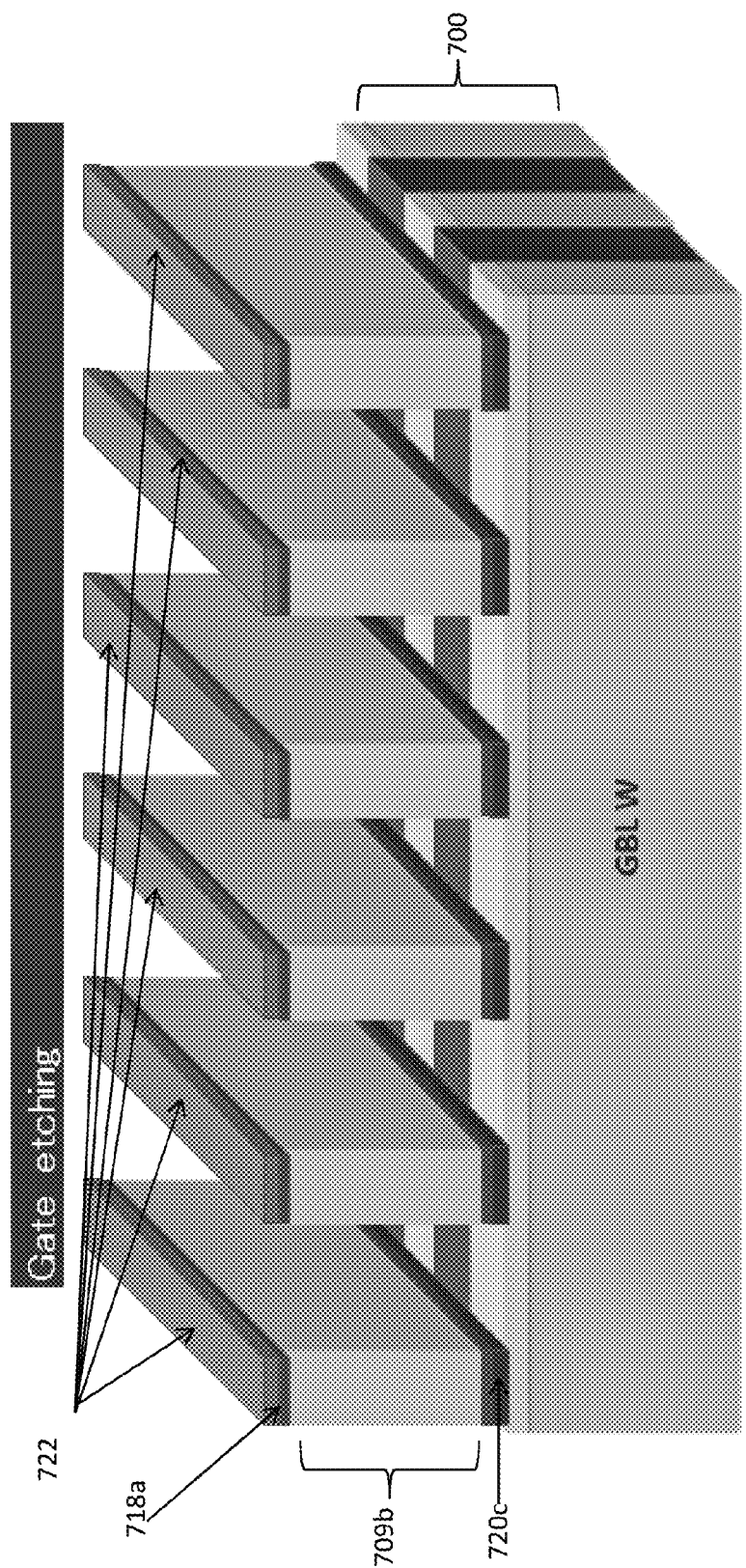

Referring to FIG. 7F, another step includes patterning the gate top isolation layer 718, the gate layer stack 709, and the gate bottom isolation layer 720 to form a plurality of elongated gate lines (e.g., rails 722) extending along a second horizontal direction (as shown, the x-direction) transverse to the first horizontal direction (as shown, the y-direction). Following the patterning, each elongated gate line 722 includes a top insulating layer 718a, a gate body layer or stack 709b, and a bottom insulating later 720c.

In various embodiments, the step of forming a plurality of elongated gate lines 712 may include any suitable patterning technique. For example, a patterned mask (e.g., a hard mask and/or photoresist) may be formed using photolithography and etching that exposes only portions of the underlying structure intended for removal. An etching process may then be used remove exposed portions of gate top isolation layer, the gate layer stack 709, and the gate bottom isolation layer to form a plurality of elongated gate lines 722. The mask may then be removed, e.g., using a chemical mechanical polishing process (or etching for a hardmask or ashing for a photoresist) to expose a surface than includes the tops, e.g., 718a of the elongated gate lines 722.

Figure 7G:
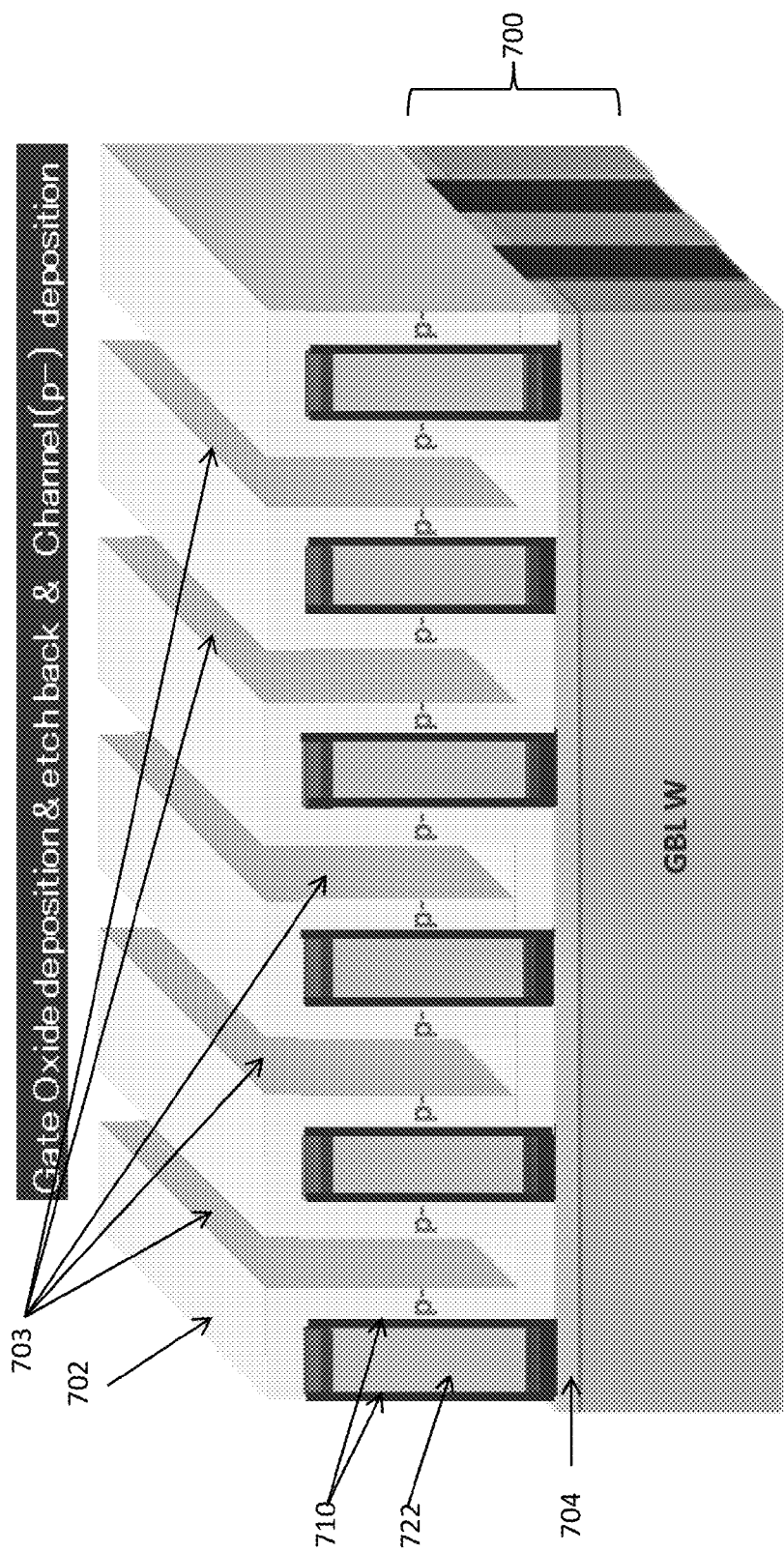

Referring to FIG. 7G, another step includes forming gate insulating material 710 on lateral sides of the elongated gate lines 722. For example, in some embodiments, an insulating material such as an oxide (e.g., $SiO_2$) may be deposited over the gate lines 722 and then etched back such that the insulting material only remains on the lateral sides of the elongated gate lines 722. The next step includes forming a conformal layer of channel semiconductor material 702 on the gate lines 722 and the drain material, the channel semiconductor material having a second conductivity type opposite the first conductivity type. The conformal layer 702 defines troughs 703 extending along the second horizontal direction (e.g., the x-direction) between the gate lines.

Figure 7H:
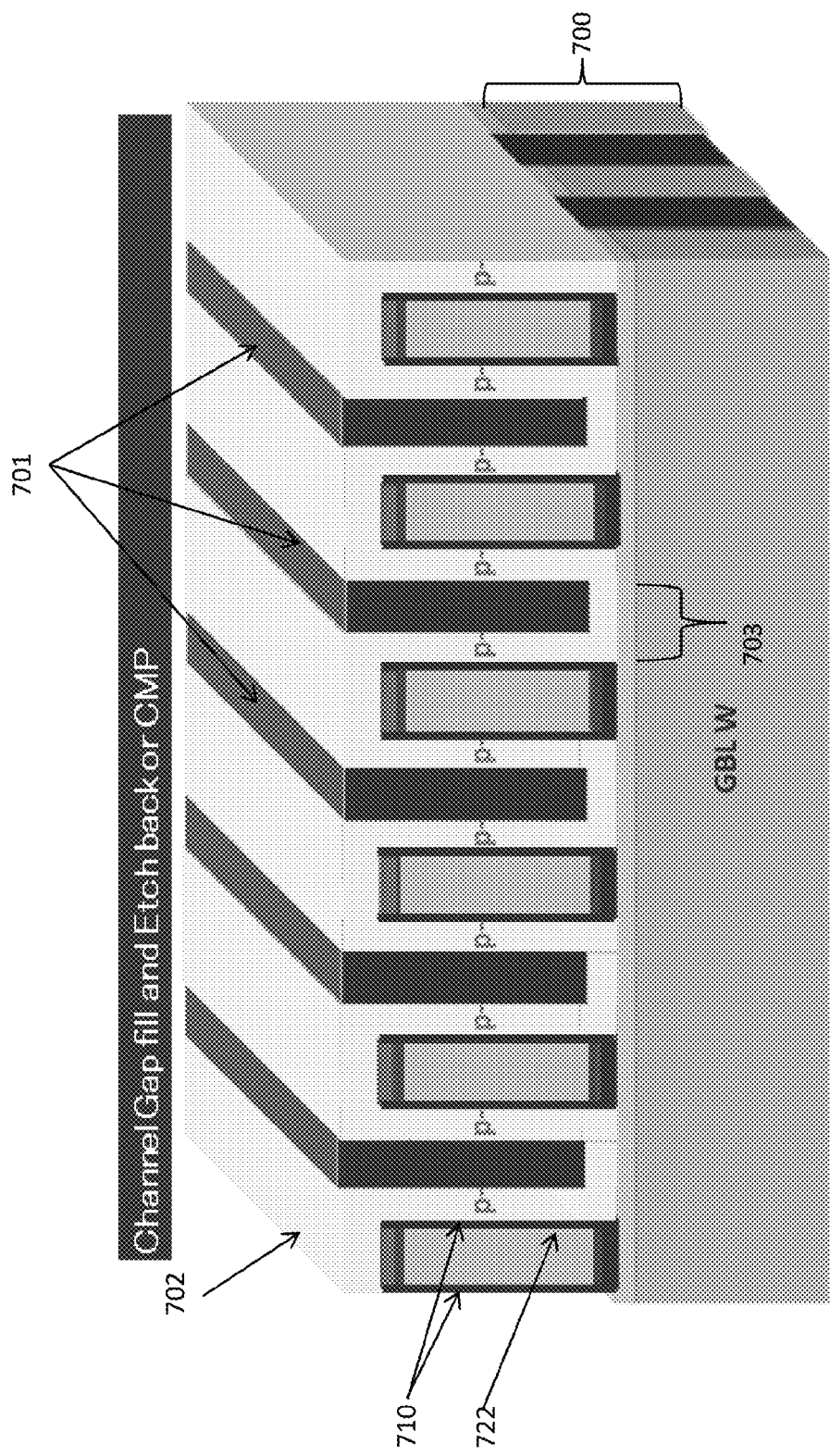
Figure 71:
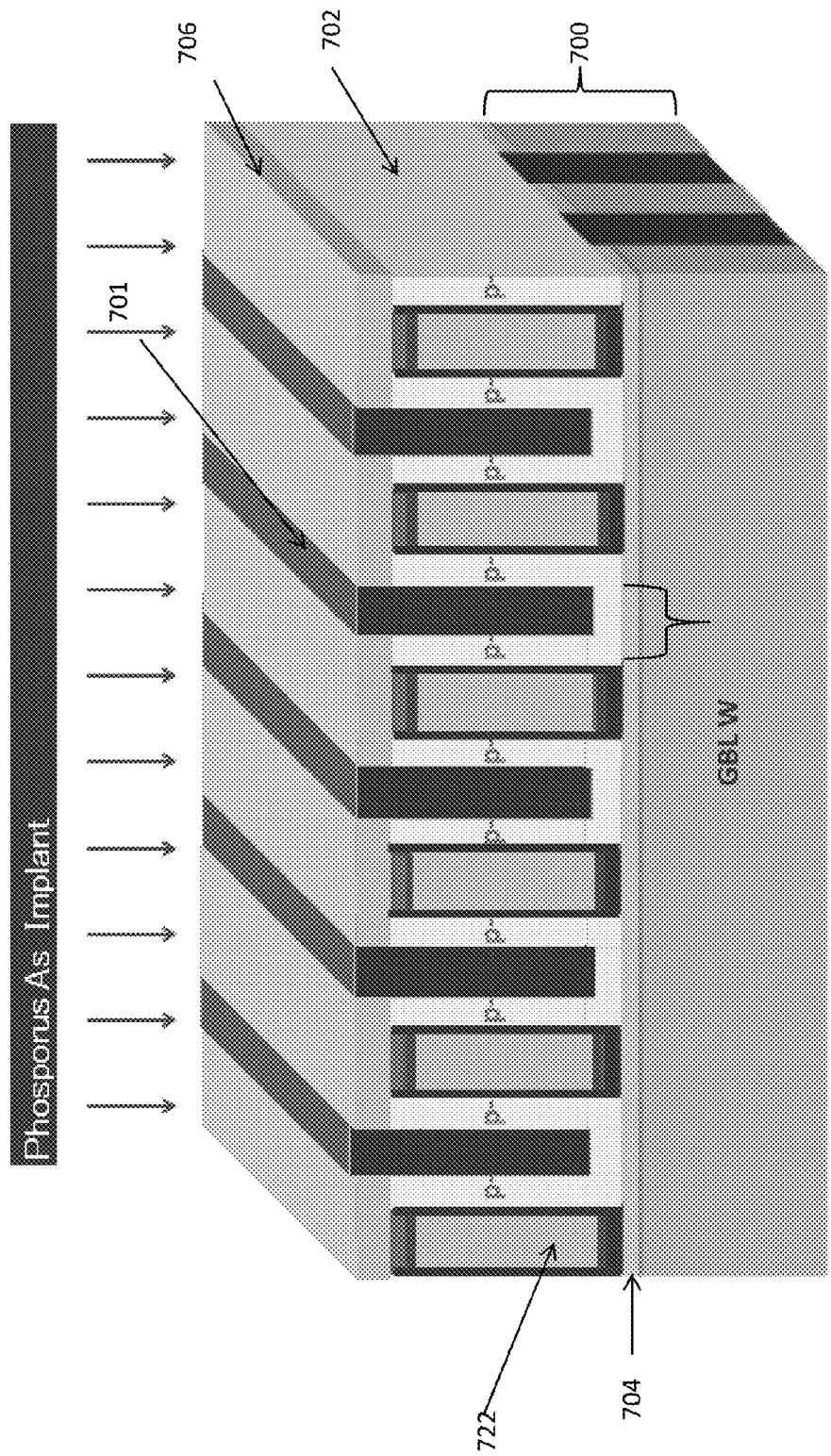

Referring to FIG. 7H, the next step includes filling the troughs 703 with an electrically insulating fill material 701. This filing step may be followed by a planarization step, such as an etch back or chemical mechanical polishing process that exposes a surface of the top portions of the conformal layer 702.

Referring to FIG. 7I, the next step includes doping top portions of the conformal layer 702 to form source regions 706 of semiconductor material having the first conductivity type extending along the tops of the gate lines 722 in the second horizontal direction (e.g., in the x-direction). For example, in some embodiments n-type dopants such as phosphorous or arsenic are implanted or diffused in into the top portion of the p-type channel portion of the conformal layer 702 to form the source regions 706.

Figure 7J:
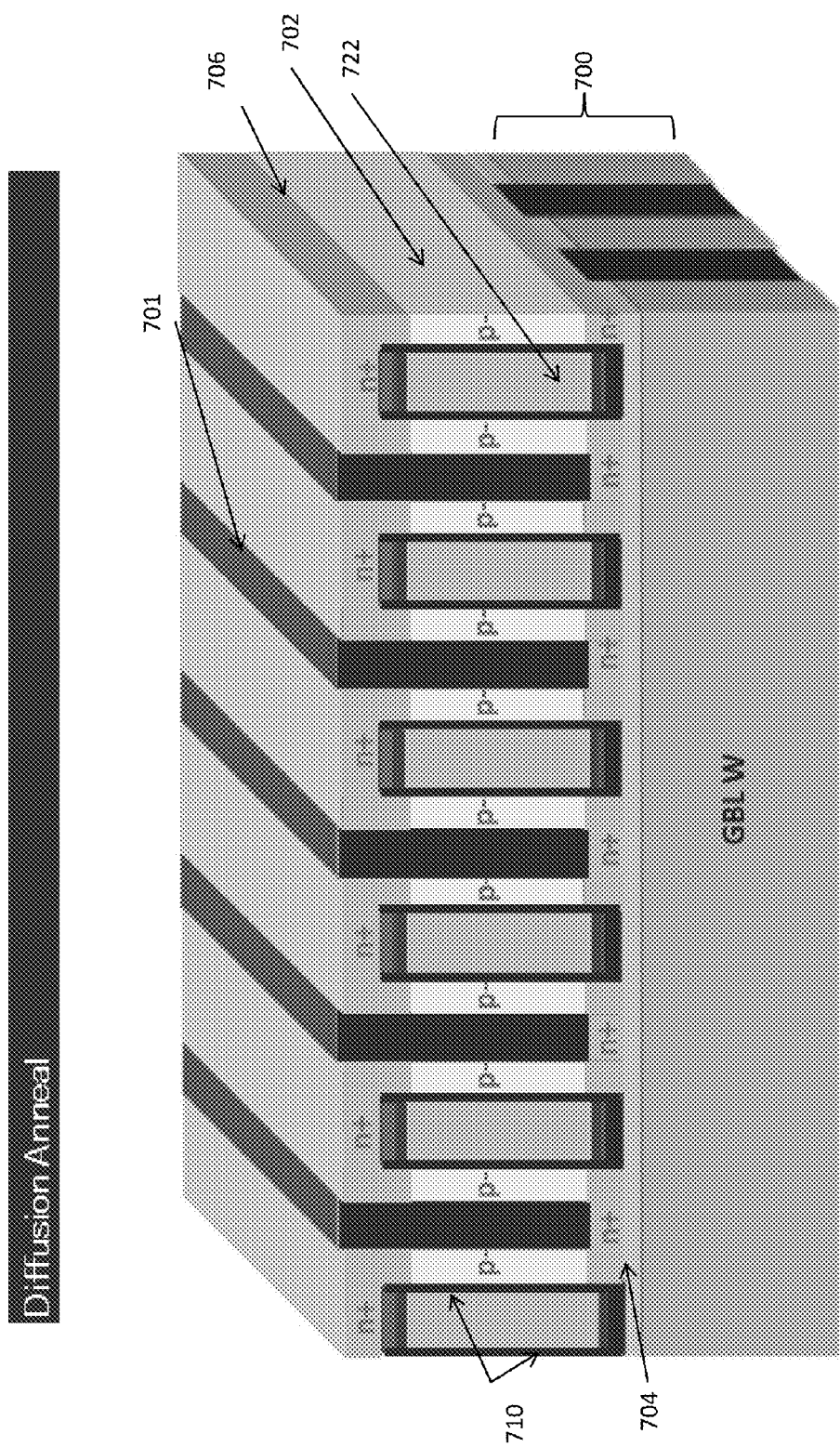

Referring to FIG. 7J, some embodiments include optional annealing of source regions 706 to cause diffusion of dopants of the first conductivity type (e.g. phosphorous or arsenic) from the top portions of conformal layer 702 downward into vertical side portions of the conformal layer 702 adjacent to vertical sides of the gate lines 722. The annealing may also cause diffusion of n-type dopants from the drain layer 704 upward into the bottom portions of the conformal p-type channel layer 702, thereby separating layer 702 into discreet p-type channels 702a, 702b, 702c, etc. by the dielectric 701 filled troughs 703 on the sides and by the expanded n-type source 706 and drain 704 region on the top and bottom, respectively. The resulting structure is shown in FIG. 7K.

Figure 7K:
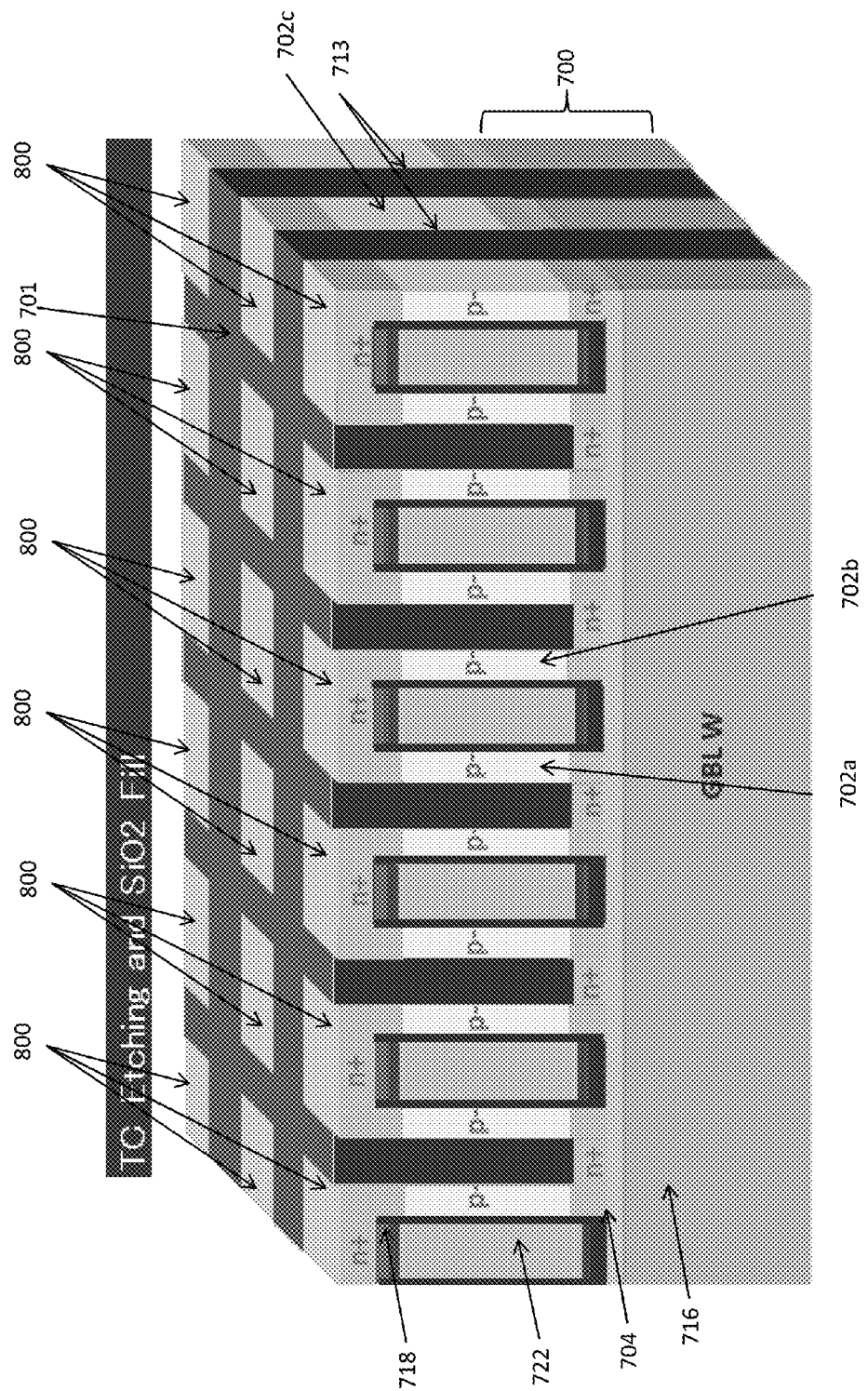

Referring to FIG. 7K the next step includes patterning the conformal layer 702 and the insulating fill material 701 to form one or more pillars 800. Each resulting pillar 800 corresponds to a dual channel transistor 200 of the type described in detail above with reference to FIGS. 4-6.

In various embodiments, the step of patterning the conformal layer 702 and the insulating fill material 701 to form one or more pillars 800 may include any suitable patterning technique. For example, a patterned mask (e.g., a hardmask and/or photoresist) may be formed using photolithography and etching that exposes only portions of the underlying structure intended for removal. An etching process may then be used remove exposed portions of the conformal layer 702, source region 706, and the insulating fill material 701, the drain material 704 and the drain line layer 716 to form trenches 713 separating one or more pillars 800 and the drain lines 716. The mask may then be removed using, e.g., etching, chemical mechanical polishing, or ashing to expose a surface of the tops of the pillars 800.

In some embodiments, during the step of patterning the conformal layer 702 and the insulating fill material 701 to form one or more pillars 800, the top insulating layer 718 acts as a hard mask to prevent removal of the underlying gate body layer (e.g., stack 709 or single layer 708) such that the trenches 713 do not cut through the gates 708.

The trenches 713 between the pillars 800 are filled with electrically insulating material 701, followed by planarization of the material 701, e.g. by etching or chemical mechanical polishing.

As noted above, in the embodiment shown wherein each pillar 800 includes a single field effect transistor 200 of the type described above. The resulting structure corresponds to that shown in FIG. 7K. Each gate line extends through a plurality of pillars 800 arranged in a line along the second horizontal direction. A line of pillars 800 arranged along the first horizontal direction corresponds to transistors 200 that share a common drain contact line and a common drain.

Some embodiments further include forming a source contact line 512 (shown in FIG. 5) in electrical contact with the source 706 of a transistor 200 included in at least one pillar 800. In some embodiments, the source 706 of a transistor 200 in a pillar 800 may include silicon, the source contact line may include a metal, and a metal silicide contact 514 (shown in FIG. 5) may be formed located between the source and the source contact line.

Although in the examples shown in FIGS. 7A-7K the first conductivity type is n-type and the second conductivity type is p-type, it is to be understood that in other embodiments the first conductivity type is p-type and the second conductivity type is n-type. Further, as noted above in general the role of the source and the drain for one or more of the transistors 200 may be reversed.

Dual channel transistors 200 of the type described herein may, in various embodiments, exhibit some or all of the following advantageous characteristics. In some embodiments, the channels 202 may be free or substantially free of metal contamination which would cause a high leak current. For example, in the fabrication process described above in FIGS. 7A-7K, the channels 202 are not exposed to metal.

In some embodiments, the channels 202 may be free or substantially free of damage from plasma processes. For example, the fabrication process described above in FIGS. 7A-7K, the channel may be formed using deposition process that reduces or eliminates plasma damage, such a self aligned polysilicon deposition process.

Unlike the single channel transistor 100 show in FIG. 2, embodiments the dual channel transistor 200 (e.g., as shown in FIGS. 4-6) do not include a gate bottom isolation layer having a corner region which is subject breakdown leading to a "hot spot" current leakage effect.

In comparison to the single channel transistor 100, the dual channel transistor 200 may feature reduced gate to gate isolation breakdown because the gates 208 of adjacent transistors 200 may be electrically isolated from each other by the presence of relatively thick channels 202 and channel isolation layers. This wider separation of adjacent gates 208 may also result in reduced capacitance between the gates 208.

In some embodiments of the dual channel transistor 200, the height of the gate 208 may be reliably determined, e.g., by controlling the deposition step shown in FIG. 7E. In some embodiments, the on-wafer variation in gate height may be less than 50 nm, or preferably less than 20 nm.

In some embodiments of the dual channel transistor 200, the gate 208 and the source 206 may be well aligned. For example, as shown in FIG. 7I, in some embodiments, the source/gate alignment is accomplished using a reliable dopant implantation process and does not require, e.g., alignment of multiple photolithographic processes.

In some embodiments of the dual channel transistor 200, the inclusion of top and bottom gate barrier layers 218/220 provides reduced gate resistance.

In some embodiments of the dual channel transistor 200, a wide contact area (e.g., source region 206) is provided for connection to a memory cell device. For example, source region 206 may provide a wide contact region for electrical connection to a local bit line LBL in the ReRAM device of FIG. 1. Furthermore, the gate 208 may be fully isolated during fabrication when the contact is formed.

Some embodiments may include forming a three dimensional solid state memory device, where the field effect transistors 200 in the pillars 800 each comprise memory cell select gate for the three dimensional solid state memory device. For example, as described above, the three dimensional solid state memory device may include a three dimensional ReRAM memory device or a vertical NAND device. In some embodiments, the ReRAM memory cells shown in FIG. 1 may be formed monolithically over the device shown in FIG. 7K. The source 506 and/or source line 512 for each transistor 200 connects electrically to a local bit line LBL of the device of FIG. 1, such that each transistor 200 acts as a select transistor for the ReRAM memory cells.

Similarly, in other embodiments, NAND memory cells described in FIGS. 8A-9B below may be formed monolithically over the device shown in FIG. 7K, with electrical connections as shown in FIGS. 8A and 9B and described in detail below, such that each transistor 200 acts as a bottom select transistor for the vertical NAND memory cells in a monolithic three dimensional NAND memory device. In this configuration, the source and drain regions 206, 204 and the source and drain lines 212, 216 of the transistor 200 may be reversed if the bottom of the vertical NAND string is the source side of the string. Thus, the transistor acts as a source side select transistor for the NAND string rather than as a drain side select transistor.

Referring to FIGS. 8A-9B, in some embodiments, the monolithic three dimensional NAND string 1180 comprises a semiconductor channel 1 having at least one end portion extending substantially perpendicular to a major surface 1100a of a base layer 1100, as shown in FIGS. 8A and 9A. For example, the semiconductor channel 1 may have a pillar shape and the entire pillar-shaped semiconductor channel in the NAND memory cell area extends substantially perpendicularly to the major surface 1100a of the base layer 1100, as shown in FIGS. 8A and 9A. In these embodiments, the source/drain electrodes of the device can include an upper electrode 1202 (e.g., drain electrode or contact line) formed over the semiconductor channel 1, as shown in FIGS. 8A and 9A. A drain select transistor at the top of the channel is not shown for clarity. An optional body contact electrode 1102 may be disposed in the base layer 1100 to provide body contact to the connecting portion of the semiconductor channel 1 from below. The NAND string's 1180 select gate or access transistors may be a dual channel transistor 200, e.g., of the type described with reference to FIGS. 4-6 above. The doped region 206 at the top of the transistor 200 may be omitted and the top portion of each channel 202 of the transistor may be electrical contact with the semiconductor channel 1 of the NAND sting's memory cell portion. A gate 208 may be formed below the NAND string 1180, e.g., in the base layer 1100. The gate 208 may include a gate isolation layer (e.g., layer 210 as shown in FIG. 4) electrically insulating the gate 208 from the doped source or drain region 204 and the channels 1, 202. The gate 208 may comprise or be in electrical contact with a select electrode of the NAND string 1180, e.g., a conductive rail (not shown) extending in the direction into and out of the page in FIGS. 8A and 9A.

Dual channels 202 are located adjacent to each of the lateral sidewalls of the gate 208. In some embodiments, the base layer 1100 may include a source or drain contact line 316 made of a conductive material (e.g., a metal, metal silicate, or metal nitride) formed below the doped source or drain region 204. The contact 316 may be formed on a substrate 300 (e.g., as shown in FIG. 4).

As will be apparent to one skilled in the art in view of the present disclosure, in some embodiments an array of NAND strings 1180 may be formed monolithically above the array of transistors 200 shown in FIGS. 6 and 7K, with each transistor 200 functioning as a select gate or access transistor for a respective NAND string 1180.

In some embodiments, the semiconductor channel 1 may be a filled feature, as shown in FIGS. 9A-9B. In some other embodiments, the semiconductor channel 1 may be hollow, for example a hollow cylinder filled with an insulating fill material 2, as shown in FIGS. 8A-8B. In these embodiments, and an insulating fill material 2 may be formed to fill the hollow part surrounded by the semiconductor channel 1.

The base layer 1100 can include, e.g., any semiconducting substrate 300 known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The base layer 1100 may include integrated circuits fabricated thereon, such as the select transistors 200 (e.g., as shown in FIGS. 8A and 9A) and/or driver circuits for a memory device.

Any suitable semiconductor materials can be used for semiconductor channel 1, for example silicon, germanium, silicon germanium, or other compound semiconductor materials, such as III-V, II-VI, or conductive or semiconductive oxides, etc. materials. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recrystallized polycrystalline semiconductor material formed by recrystallizing an initially deposited amorphous semiconductor material.

The insulating fill material 2 may comprise any electrically insulating material, such as silicon oxide, silicon nitride, silicon oxynitride, or other high-k insulating materials.

The monolithic three dimensional NAND string further comprise a plurality of control gate electrodes 3, as shown in FIGS. 8A-9B. The control gate electrodes 3 may comprise a portion having a strip shape extending substantially parallel to the major surface 1100a of the base layer 1100. The plurality of control gate electrodes 3 comprise at least a first control gate electrode 3a located in a first device level (e.g., device level A) and a second control gate electrode 3b located in a second device level (e.g., device level B) located over the major surface of the base layer below the device level A. The control gate material may comprise any one or more suitable conductive or semiconductor control gate material known in the art, such as doped polysilicon, tungsten, copper, aluminum, tantalum, titanium, cobalt, titanium nitride or alloys thereof. For example, in some embodiments, polysilicon is preferred to allow easy processing.

A blocking dielectric 7 is located adjacent to and may be surrounded by the control gate(s) 3. The blocking dielectric 7 may comprise a plurality of blocking dielectric segments located in contact with a respective one of the plurality of control gate electrodes 3, for example a first dielectric segment 7a located in device level A and a second dielectric segment 7b located in device level B are in contact with control electrodes 3a and 3b, respectively, as shown in FIGS. 8A-9B. Alternatively, the blocking dielectric 7 may be continuous (not shown).

The monolithic three dimensional NAND string may also comprise a plurality of discrete charge storage segments 9, each of which is located between the blocking dielectric segments 7 and the channel 1. Similarly, the plurality of discrete charge storage segments 9 comprise at least a first discrete charge storage segment 9a located in the device level A and a second discrete charge storage segment 9b located in the device level B. Alternatively, the charge storage segment(s) 9 may be continuous (not shown). That is, the charge storage segments may comprise localized regions in a continuous charge storage layer.

The tunnel dielectric 11 of the monolithic three dimensional NAND string is located between each one of the plurality of the discrete charge storage segments 9 and the semiconductor channel 1. The tunnel dielectric 11 may comprise a plurality of blocking dielectric segments 11 or a continuous layer of dielectric material.

The blocking dielectric 7 and the tunnel dielectric 11 may be independently selected from any one or more same or different electrically insulating materials, such as silicon oxide, silicon nitride, silicon oxynitride, or other high-k insulating materials.

The charge storage segment(s) 9 may comprise a discrete or continuous conductive (e.g., metal or metal alloy such as titanium, platinum, ruthenium, titanium nitride, hafnium nitride, tantalum nitride, zirconium nitride, or a metal silicide such as titanium silicide, nickel silicide, cobalt silicide, or a combination thereof) or semiconductor (e.g., polysilicon) floating gate, conductive nanoparticles, or a discrete or continuous charge storage dielectric (e.g., silicon nitride or another dielectric) feature. For example, in some embodiments, the discrete charge storage segments 9 are discrete charge storage dielectric features, each of which comprises a nitride feature located in the respective clam-shaped blocking dielectric segment 7, where the silicon oxide blocking dielectric segment 7, the nitride feature 9 and the silicon oxide tunnel dielectric 11 form oxide-nitride-oxide discrete charge storage structures of the NAND string. Alternatively, a polysilicon floating gate may be used.

In various embodiments, the NAND device may include any of the features described in U.S. Pat. No. 8,187,936 issued on May 29, 2013, U.S. patent application Ser. No. 14/133,979 filed Dec. 19, 2013, and U.S. patent application Ser. No. 14/136,103 filed Dec. 20, 2013, all of which are incorporated herein by reference in their entirety.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A device comprising one or more field effect transistors, each field effect transistor comprising:
   an elongated drain contact line comprising an electrically conductive material extending along a first horizontal direction;
   a drain comprising a first conductivity type semiconductor region overlaying the drain contact line;
   a source comprising a first conductivity type semiconductor region located above the drain;
   a gate extending vertically between the drain and the source,
   wherein:
      the gate is elongated along a second horizontal direction transverse to the first horizontal direction;
      the gate comprises a first vertical side and an opposing second vertical side, each vertical side contacting a gate insulating material;
      the gate comprises a top portion adjacent to the source and electrically insulated from the source by a gate top isolation layer of insulating material; and
      the gate comprises a bottom portion adjacent to the drain and electrically insulated from the drain by a gate bottom isolation layer of insulating material; and
   a first channel and a second channel, each comprising a second conductivity type semiconductor region different from the first conductivity type,
   wherein:
   the first channel extends vertically from the drain to the source and is located on the first vertical side of the gate and is electrically insulated from the gate by the gate insulating material contacting the first vertical side of the gate;
   the second channel extends vertically from the drain to the source and is located on the second vertical side of the gate and is electrically insulated from the gate by the gate insulating material contacting the second vertical side of the gate; and
   the source, the first channel and the second channel collectively constitute a pillar having a single continuous top surface such that a first sidewall surface of the pillar that adjoins a periphery of the top surface of the pillar includes a surface of the first channel and a first surface of the source, and a second sidewall surface of the pillar that adjoins the periphery of the top surface of the pillar includes a surface of the second channel and a second surface of the source.

2. The device of claim 1, wherein the top and bottom portions of the gate each comprise a layer of TiN and the gate comprises a middle portion of doped polysilicon sandwiched between the layers of TiN.

3. The device of claim 1, wherein the gate comprises a layer of metal or metal nitride extending from the source to the drain.

4. The device of claim 1, wherein the first and the second channel comprise doped polysilicon.

5. The device of claim 1, wherein the elongated drain line comprises at least one of: W, Mo, Cr, a noble metal, or a metal silicide.

6. The device of claim 1, further comprising a source contact line in electrical contact with the source.

7. The device of claim 6, wherein the source comprises silicon, the source contact line comprises a metal, and further comprising a metal silicide contact located between the source and the source contact line.

8. The device of claim 1, wherein the first conductivity type is n-type and the second conductivity type is p-type.

9. The device of claim 1, wherein the first conductivity type is p-type and the second conductivity type is n-type.

10. The device of claim 1, further comprising a three dimensional solid state memory device, wherein the one or more field effect transistor devices comprise a memory cell select transistor for the three dimensional solid state memory device.

11. The device of claim 10, wherein the three dimensional solid state memory device comprises a three dimensional ReRAM memory device or a vertical NAND device.

12. The device of claim 1, wherein the one or more field effect transistors comprises a first transistor and a second transistor, wherein:
the first and second transistors share the common elongated drain contact line; and
the respective gates of the first and second transistors are electrically insulated from each other.

13. The device of claim 12, further comprising an electrically insulating material that fills a space between the respective channels and source of the first transistor and the respective channel and source of the second transistor.

14. The device of claim 13, wherein the one or more field effect transistors further comprises a third transistor, wherein:
the first and third transistor devices share a common gate; and
the respective drains of the first and third transistors are electrically insulated from each other.

15. The device of claim 14, further comprising an electrically insulating material that fills a space between the respective channels and source of the first transistor and the respective channels and source of the third transistor.

16. The device of claim 1, wherein the one or more field effect transistors comprise a rectangular array of transistors having lines of transistors arranged horizontally along x and y directions, wherein:
transistors in each line along the x-direction each share a common elongated drain contact line and a common drain and have respective gates that are electrically insulated from each other; and
transistors in each line along the y-direction each share a common gate, and have respective drains that are electrically insulated from each other.

17. The device of claim 1, wherein the source extends over an entire upper surface of the gate.

18. A vertical channel field effect transistor device, comprising:
a substrate;
an elongated contact line located above the substrate;
a gate located above the substrate and above the contact line;
one of a source or a drain located between the gate and the substrate and in electrical contact with the elongated contact line;
another one of the source or the drain located above the gate;
a first channel located adjacent to a first lateral side of the gate;
a second channel located adjacent to a second lateral side of the gate opposite to the first lateral side;
a first gate insulating layer located between the first channel and the first lateral side of the gate; and
a second gate insulating layer located between the second channel and the second lateral side of the gate;
wherein:
lower portions of the first and the second channels contact the one of the source or the drain located between the gate and the substrate;
upper portions of the first and the second channels contact the another one of the source or the drain located above the gate;
the another one of the source or the drain located above the gate comprises a semiconductor material portion; and
the semiconductor material portion, the first channel and the second channel collectively constitute a pillar having a single continuous top surface such that a first sidewall surface of the pillar that adjoins a periphery of the top surface of the pillar includes a surface of the first channel and a first surface of the semiconductor material portion, and a second sidewall surface of the pillar that adjoins the periphery of the top surface of the pillar includes a surface of the second channel and a second surface of the semiconductor material portion.

19. The device of claim 18, further comprising:
a first insulating isolation layer located adjacent to the first channel;
a second insulating isolation layer located adjacent to the second channel;
a third insulating isolation layer located below the gate between the one of the source or the drain and the gate;
a fourth insulating isolation layer located above the gate between the another one of the source or the drain and the gate; and
a fifth insulating isolation layer and a sixth insulating isolation layer;
wherein the first and the second insulating isolation layers electrically separate the first channel from the second channel of an adjacent first transistor;
wherein the third and the fourth insulating isolation layers electrically separate the gate from the source and the drain; and
wherein the fifth and the sixth insulating isolation layers electrically separate the source, the first channel and the second channel from a respective source, first channel and second channel of adjacent second and third transistors.

20. The device of claim 18, wherein the semiconductor material portion over an entire upper surface of the gate.

21. A device comprising at least one vertical field effect transistor, the device comprising:
a first semiconductor portion having a doping of a first conductivity type and located over a substrate;
a patterned gate layer including at least one conductive material overlying the first semiconductor portion;
a first gate insulating material layer contacting a first lateral sidewall of the patterned gate layer;
a second gate insulating material layer contacting a second lateral sidewall of the patterned gate layer;
a first channel and a second channel that comprise a semiconductor material having a doping of a second conductivity type that is the opposite of the first conductivity type and contact the first semiconductor portion, wherein the first channel contacts a sidewall of the first insulating material layer and the second channel contacts a sidewall of the second insulating material layer; and
a second semiconductor portion having a doping of the first conductivity type and overlying a top surface of the patterned gate layer and contacting a top surface of the first channel and a top surface of the second channel,
wherein:
one of the first and second semiconductor portions comprises a drain region of a vertical field effect transistor, and another of the first and second semiconductor portions comprises a source region of the vertical field effect transistor; and the second semiconductor portion, the first channel, and the second channel collectively constitute a pillar having a single continuous top surface such that a first sidewall surface of the pillar that adjoins a periphery of the top surface of the pillar includes a surface of the first channel and a first surface of the second semiconductor portion, and a second sidewall surface of the pillar that adjoins the periphery of the top surface of the pillar includes a surface of the second channel and a second surface of the second semiconductor portion.

22. The device of claim 21, wherein each field effect transistor further comprises a patterned stack of material layers having a pair of lateral sidewalls that are parallel to each other, wherein the patterned stack of material layers comprises, from bottom to top, a patterned gate bottom isolation layer including a first insulating material, the patterned gate layer including at least one conductive material, and a patterned gate top isolation layer including a second insulating material.

23. The device of claim 22, wherein:

the first semiconductor portion laterally extends along a first horizontal direction;

the patterned gate bottom isolation layer, the patterned gate layer, and the patterned gate top isolation layer have a same width along the first horizontal direction; and the patterned stack of material layers, the first channel, and the second channel have a same lateral extent along a second horizontal direction that is transverse to the first horizontal direction.

24. The device of claim 22, wherein the patterned gate bottom isolation layer is in contact with a top surface of the first semiconductor portion.

25. The device of claim 24, wherein an interface between the first channel and the first semiconductor portion is located above a horizontal plane including an interface between the patterned gate bottom isolation layer and the first semiconductor portion.

26. The device of claim 22, wherein the patterned gate top isolation layer is in contact with a bottom surface of the second semiconductor portion.

27. The device of claim 26, wherein an interface between the first channel and the second semiconductor portion is located below a horizontal plane including an interface between the patterned gate top isolation layer and the second semiconductor portion.

28. The device of claim 22, wherein:

sidewalls of the patterned gate bottom isolation layer contact the first and second gate insulating material layers; and sidewalls of the patterned gate top isolation layer contact the first and second gate insulating material layers.

29. The device of claim 21, wherein the first semiconductor portion is a portion of an elongated line structure laterally extending along a first horizontal direction, and contacts a top surface of a conductive contact line having a same width as the first semiconductor portion.

30. The device of claim 21, wherein the device comprises a plurality of vertical field effect transistors in a two-dimensional array.

31. The device of claim 30, wherein the device comprises a plurality of elongated line structures that are laterally spaced apart, wherein each elongated line structure comprises a plurality of first semiconductor portions of vertical field effect transistors positioned along a first horizontal direction.

32. The device of claim 31, wherein:

a plurality of electrically insulating fill material portions is located at a same level as the plurality of elongated line structures to provide electrical isolation among the plurality of elongated line structures; and the device further comprises a contiguous electrically insulating fill material portion laterally surrounding each second semiconductor portion and contacting a top surface of each elongated line structure and top surfaces of the plurality of electrically insulating fill material portions.

33. The device of claim 31, wherein each patterned gate layer, each first gate insulating material layer, and each second gate insulating layer laterally extend along a second direction that is transverse to the first direction, and overlie the plurality of elongated line structures.

34. The device of claim 31, wherein the second semiconductor portions are arranged in a two-dimensional periodic array having a periodicity along the first horizontal direction and another periodicity along a second horizontal direction that is transverse to the first horizontal direction.

35. The device of claim 30, wherein a contiguous electrically insulating fill material portion contacts a sidewall of each first channel, a sidewall of each second channel, and sidewalls of each second semiconductor portion.

36. The device of claim 35, wherein the contiguous electrically insulating fill material portion overlies multiple portions of each patterned gate layer.

37. The device of claim 35, wherein top surface of the second semiconductor portions are within a same horizontal plane as a top surface of the contiguous electrically insulating fill material portion.

38. The device of claim 21, wherein the device is a three dimensional solid state memory device selected from a three dimensional ReRAM memory device or a vertical NAND device.

* * * * *